United States Patent
Iwayama

(10) Patent No.: US 12,400,711 B2
(45) Date of Patent: Aug. 26, 2025

(54) MEMORY DEVICE DETERMINING TARGET RESISTANCE STATES

(71) Applicant: Kioxia Corporation, Tokyo (JP)

(72) Inventor: Masayoshi Iwayama, Seoul (KR)

(73) Assignee: Kioxia Corporation, Tokyo (JP)

( * ) Notice: Subject to any disclaimer, the term of this patent is extended or adjusted under 35 U.S.C. 154(b) by 175 days.

(21) Appl. No.: 18/467,094

(22) Filed: Sep. 14, 2023

(65) Prior Publication Data

US 2024/0145001 A1 May 2, 2024

(30) Foreign Application Priority Data

Oct. 26, 2022 (JP) .................................. 2022-171279

(51) Int. Cl.
| | |
|---|---|
| G11C 13/00 | (2006.01) |
| G11C 11/16 | (2006.01) |
| H10N 50/10 | (2023.01) |
| H10N 50/80 | (2023.01) |

(52) U.S. Cl.
CPC .......... *G11C 13/004* (2013.01); *G11C 11/161* (2013.01); *G11C 11/1673* (2013.01); *G11C 11/1675* (2013.01); *G11C 11/1697* (2013.01); *G11C 13/0038* (2013.01); *G11C 13/0069* (2013.01); *H10N 50/10* (2023.02); *H10N 50/80* (2023.02)

(58) Field of Classification Search
CPC . G11C 13/004; G11C 11/161; G11C 11/1673; G11C 11/1675; G11C 11/1697; G11C 13/0038; G11C 13/0069; G11C 2013/0057; G11C 11/1655; G11C 11/1657; H10N 50/10; H10N 50/80; H10B 61/10
See application file for complete search history.

(56) References Cited

U.S. PATENT DOCUMENTS

| | | | |
|---|---|---|---|
| 6,462,981 B2 | 10/2002 | Numata et al. | |
| 7,948,813 B2 | 5/2011 | Abe | |
| 2021/0027837 A1* | 1/2021 | Kim | G11C 13/0061 |
| 2021/0090629 A1 | 3/2021 | Hatsuda | |
| 2021/0295888 A1 | 9/2021 | Osada et al. | |
| 2022/0005529 A1* | 1/2022 | Hirano | G11C 16/32 |
| 2023/0081718 A1 | 3/2023 | Iwayama | |
| 2023/0088745 A1 | 3/2023 | Kobayashi et al. | |

FOREIGN PATENT DOCUMENTS

| | | |
|---|---|---|
| JP | 3985432 B2 | 10/2007 |
| JP | 5173706 B2 | 4/2013 |
| JP | 2021047950 A | 3/2021 |
| JP | 2021150497 A | 9/2021 |

* cited by examiner

*Primary Examiner* — Jerome Leboeuf
(74) *Attorney, Agent, or Firm* — Holtz, Holtz & Volek PC

(57) ABSTRACT

According to one embodiment, a memory device includes first and second wiring lines, memory cells between the first and second wiring lines, each includes a resistance change memory element and a switching element, and a determination operation control circuit configured to acquire a determination target voltage, acquire a reference voltage, and determine, based on a voltage difference between the determination target voltage and the reference voltage, a determination target resistance state that was set in the resistance change memory element. The determination target voltage acquisition time point and the reference voltage acquisition time point vary according to the selected memory cell.

18 Claims, 11 Drawing Sheets

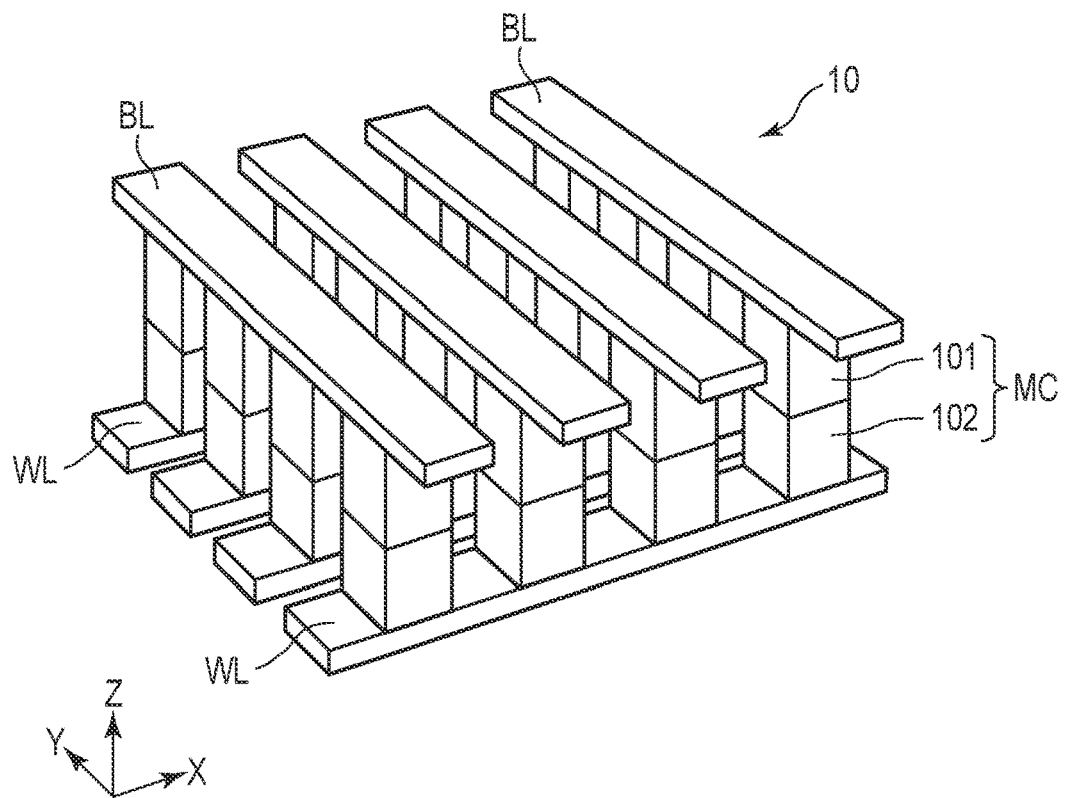
F I G. 2
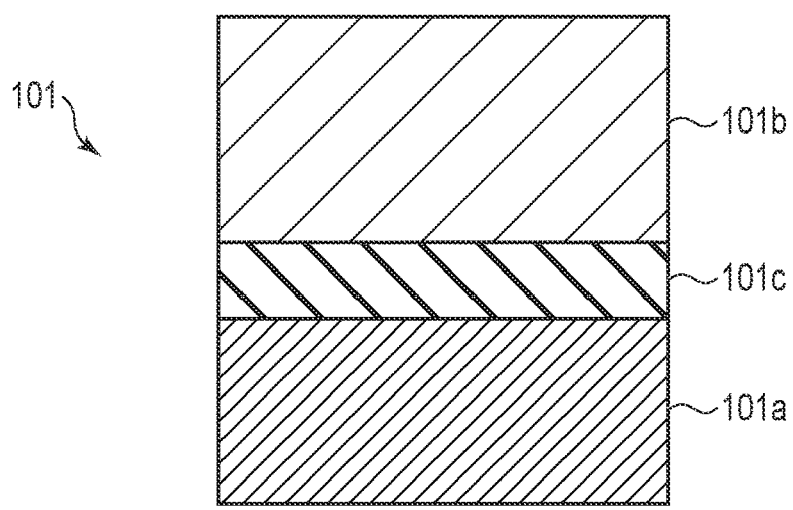
F I G. 3

MEMORY DEVICE DETERMINING TARGET RESISTANCE STATES

CROSS-REFERENCE TO RELATED APPLICATIONS

This application is based upon and claims the benefit of priority from Japanese Patent Application No. 2022-171279, filed Oct. 26, 2022, the entire contents of which are incorporated herein by reference.

FIELD

Embodiments described herein relate generally to a memory device.

BACKGROUND

A memory device is proposed in which memory cells including resistance change memory elements such as magnetoresistance effect elements and selectors (switching elements) are integrated on a semiconductor substrate.

BRIEF DESCRIPTION OF THE DRAWINGS

FIG. 2 is a perspective view schematically showing a basic configuration of a memory cell array area of the memory device according to the first embodiment.

FIG. 3 is a cross-sectional view schematically showing a configuration of a magnetoresistance effect element of the memory device according to the first embodiment.

DETAILED DESCRIPTION

Figure 1:
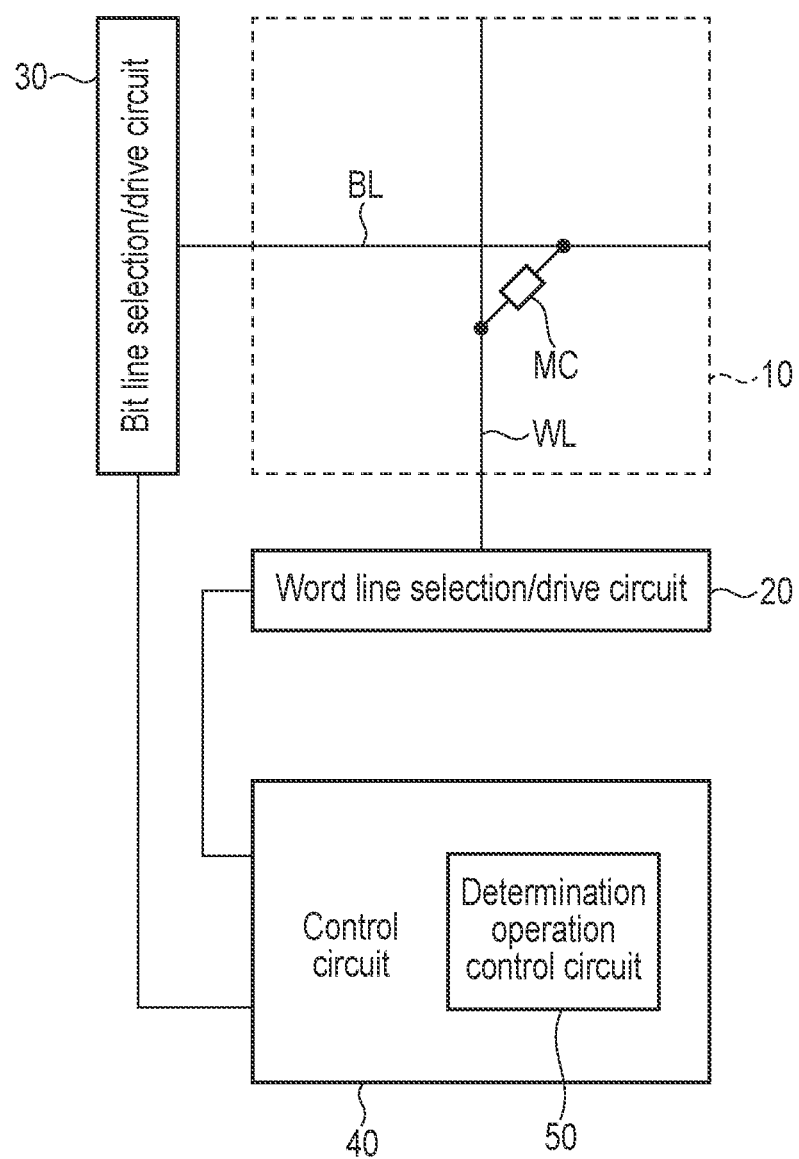
FIG. 1 shows an overall configuration of a memory device according to a first embodiment.

In general, according to one embodiment, a memory device includes: a plurality of first wiring lines, each extending in a first direction; a plurality of second wiring lines, each extending in a second direction intersecting the first direction; a plurality of memory cells connected between the plurality of first wiring lines and the plurality of second wiring lines, each of which includes a resistance change memory element capable of exhibiting a first resistance state and a second resistance state having a higher resistance than that of the first resistance state, and a switching element connected in series with the resistance change memory element and having a characteristic of changing from an off state to an on state when a voltage applied between two terminals thereof increases and reaches a first voltage, and changing from an on state to an off state when a voltage applied between the two terminals decreases and reaches a second voltage that is lower than the first voltage; and a determination operation control circuit that controls a determination operation of a resistance state of the resistance change memory element included in a selected memory cell of the plurality of memory cells connected between a selected first wiring line of the plurality of first wiring lines and a selected second wiring line of the plurality of second wiring lines, wherein the determination operation control circuit is configured to: during a first read period, set the switching element included in the selected memory cell to an on state by changing a voltage of the selected first wiring line at a first on-state setting time point while the selected second wiring line is set to a floating state, and acquire a determination target voltage applied between the selected first wiring line and the selected second wiring line at a determination target voltage acquisition time point at which a first elapsed time has elapsed from the first on-state setting time point; during a write period after the first read period, set a reference resistance state selected from the first resistance state and the second resistance state to the resistance change memory element included in the selected memory cell; during a second read period after the write period, set the switching element included in the selected memory cell to an on state by changing a voltage of the selected first wiring line at a second on-state setting time point while the selected second wiring line is set to a floating state, and acquire a reference voltage applied between the selected first wiring line and the selected second wiring line at a reference voltage acquisition time point at which a second elapsed time has elapsed from the second on-state setting time point; and determine, based on a voltage difference between the determination target voltage and the reference voltage, a determination target resistance state that was set in the resistance change memory element included in the selected memory cell prior to the first read period, and the determination target voltage acquisition time point and the reference voltage acquisition time point vary according to the selected memory cell.

In the following, embodiments will be described with reference to the drawings.

First Embodiment

FIG. 1 shows an overall configuration of a memory device according to a first embodiment.

The memory device shown in FIG. 1 includes a memory cell array area 10, a word line selection/drive circuit 20, a bit line selection/drive circuit 30, and a control circuit 40.

FIG. 2 is a perspective view schematically showing a basic configuration of the memory cell array area 10 described above.

As shown in FIG. 2, the memory cell array area 10 is provided with a plurality of word lines (first wiring lines) WL, each extending in an X direction, a plurality of bit lines (second wiring lines) BL, each extending in a Y direction that intersects the X direction, and a plurality of memory cells MC connected between the plurality of word lines WL and the plurality of bit lines BL. By passing a predetermined current between a selected word line WL connected to a selected memory cell MC and a selected bit line BL connected to the selected memory cell MC, it is possible to write to or read from the selected memory cell MC.

Each memory cell MC includes a magnetoresistance effect element (resistance change memory element) 101 that can exhibit a low resistance state (first resistance state) and a high resistance state (second resistance state) having a resistance higher than that of the low resistance state, and a selector (2-terminal type switching element) 102 connected in series to the magnetoresistance effect element 101.

Note that, in the example shown in FIG. 2, the magnetoresistance effect element 101 is provided on an upper layer side of the selector 102, but the magnetoresistance effect element 101 may be provided on a lower layer side of the selector 102. In the example shown in FIG. 2, the bit lines BL are provided on an upper layer side of the word lines WL, but the bit lines BL may be provided on a lower layer side of the word lines WL.

FIG. 3 is a cross-sectional view schematically showing a configuration of the magnetoresistance effect element 101 included in the memory cell MC. The magnetoresistance effect element 101 is a nonvolatile resistance change memory element and is a magnetic tunnel junction (MTJ) element.

As shown in FIG. 3, the magnetoresistance effect element 101 includes a storage layer (first magnetic layer) 101a, a reference layer (second magnetic layer) 101b, and a tunnel barrier layer (nonmagnetic layer) 101c.

The storage layer 101a is a ferromagnetic layer with a variable magnetization direction. The reference layer 101b is a ferromagnetic layer with a fixed magnetization direction. The tunnel barrier layer 101c is an insulating layer provided between the storage layer 101a and the reference layer 101b. Note that the variable magnetization direction means that a magnetization direction changes with respect to a given write current. The fixed magnetization direction means that a magnetization direction does not change with respect to a given write current.

In a case where the magnetization direction of the storage layer 101a is parallel to the magnetization direction of the reference layer 101b, the magnetoresistance effect element 101 is in a low resistance state, and, in a case where the magnetization direction of the storage layer 101a is antiparallel to the magnetization direction of the reference layer 101b, the magnetoresistance effect element 101 is in a high resistance state. Therefore, the magnetoresistance effect element 101 can store binary data according to the resistance state. The resistance state of magnetoresistance effect element 101 can also be set according to the direction of a write current flowing through the magnetoresistance effect element 101.

Note that the example shown in FIG. 3 is a bottom-free type magnetoresistance effect element in which the storage layer 101a is located on a lower layer side than the reference layer 101b, but a top-free type magnetoresistance effect element in which the storage layer 101a is located on an upper layer side than the reference layer 101b may also be used.

Figure 4:
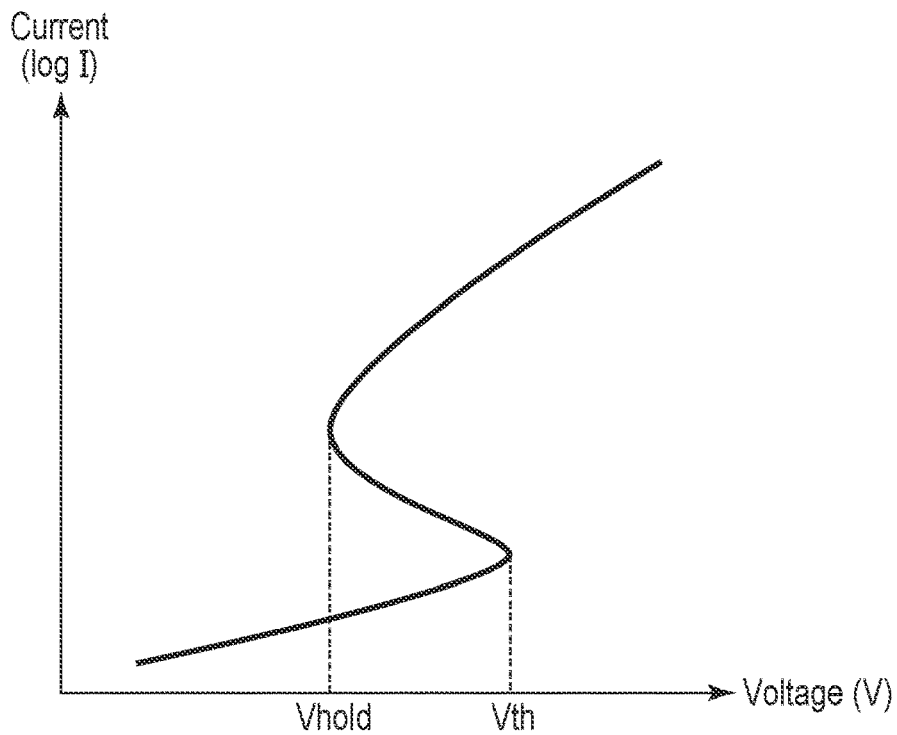
FIG. 4 schematically shows a current-voltage characteristic of a selector of the memory device according to the first embodiment.

FIG. 4 schematically shows a current-voltage characteristic of the selector (2-terminal type switching element) 102 included in the memory cell MC.

As shown in FIG. 4, in a case of performing a current sweep, the selector 102 changes from an off state to an on state when a voltage applied between two terminals increases and reaches a threshold voltage (first voltage) Vth, and changes from the on state to the off state when the voltage applied between the two terminals decreases and reaches a hold voltage (second voltage) Vhold, which is lower than the first voltage Vth.

Therefore, by applying a voltage between the word line WL and the bit line BL to place the selector 102 in the on state, a current flows to the magnetoresistance effect element 101 connected in series with respect to the selector 102, enabling write and read operations to the magnetoresistance effect element 101.

Back to the description of FIG. 1. The word line selection/drive circuit 20 selects and drives the word line WL connected to the selected memory cell MC, and the bit line selection/drive circuit 30 selects and drives the bit line BL connected to the selected memory cell MC. By applying a voltage between the selected word line WL and the selected bit line BL and passing a predetermined current through the selected memory cell MC, it is possible to write to and read from the selected memory cell MC, as described above.

The control circuit 40 performs various controls including control of the word line selection/drive circuit 20 and the bit line selection/drive circuit 30, and includes a determination operation control circuit 50. The determination operation control circuit 50 controls the determination operation of the resistance state of the magnetoresistance effect element 101 included in the selected memory cell MC. That is, the determination operation control circuit 50 determines a determination target resistance state (low resistance state or high resistance state) that is preset for the magnetoresistance effect element 101. Based on the determination target resistance state, the binary data preset in the magnetoresistance effect element 101 is determined.

First, a self-reference read operation, which is the basic principle of the determination operation of the present embodiment, is explained.

Figure 5:
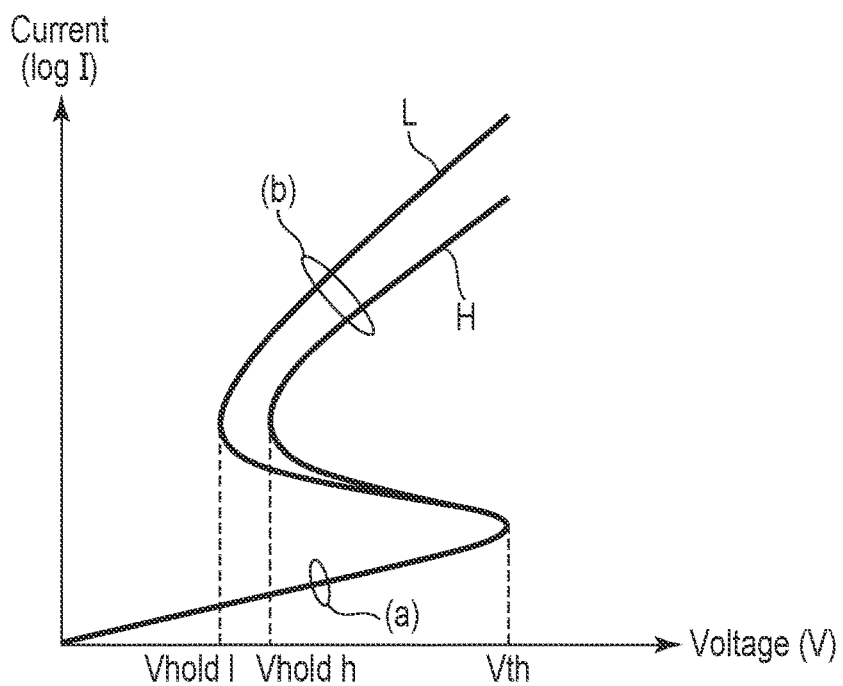
FIG. 5 schematically shows a current-voltage characteristic during reading of a selected memory cell in the memory device according to the first embodiment.

FIG. 5 schematically shows the current-voltage characteristic of the selected memory cell MC during readout. In FIG. 5, the horizontal axis shows a voltage applied between both ends of the selected memory cell MC, which roughly corresponds to a voltage applied between the selected word line WL and the selected bit line BL. The vertical axis shows a current flowing in the selected memory cell MC, which roughly corresponds to a current flowing between the selected word line WL and the selected bit line BL. The characteristic L is the characteristic when the magnetoresistance effect element 101 is set to the low resistance state, and the characteristic H is the characteristic when the magnetoresistance effect element 101 is set to the high resistance state.

In the memory cell MC containing the magnetoresistance effect element 101 and the selector 102, an off resistance of the selector 102 is generally sufficiently greater than the resistance of the magnetoresistance effect element 101 (resistance in the low resistance state and resistance in the high resistance state). Therefore, the current-voltage characteristic of the memory cell MC (corresponding to characteristic part (a)) until the selector 102 changes from the off state to the on state is substantially the same between a case where the magnetoresistance effect element 101 is set to the low resistance state and a case where the magnetoresistance effect element 101 is set to the high resistance state. That is, the voltage (threshold voltage Vth) applied between both ends of the memory cell MC when the selector 102 changes from the off state to the on state is substantially the same between a case where the selector 102 is set to the low resistance state and a case where the selector 102 is set to the high resistance state.

On the other hand, after the selector 102 is changed from the off state to the on state, the current-voltage characteristic of the memory cell MC (corresponding to a characteristic part (b)) becomes different in accordance with whether the magnetoresistance effect element 101 is in the low resistance state or the high resistance state. For example, the hold voltage applied between both ends of the memory cell MC when the selector 102 changes from the on state to the off state is Vholdl in the case where the magnetoresistance effect element 101 is in the low resistance state and Vholdh in the case where the magnetoresistance effect element 101 is in the high resistance state. Therefore, when the read current is supplied to the memory cell MC, a voltage difference occurs between both ends of the memory cell MC in accordance with whether the magnetoresistance effect element 101 is in the low resistance state or the high resistance state. Therefore, it is possible to determine the resistance state (low resistance state or high resistance state) of the magnetoresistance effect element 101 based on such a difference in voltages.

Figure 6:
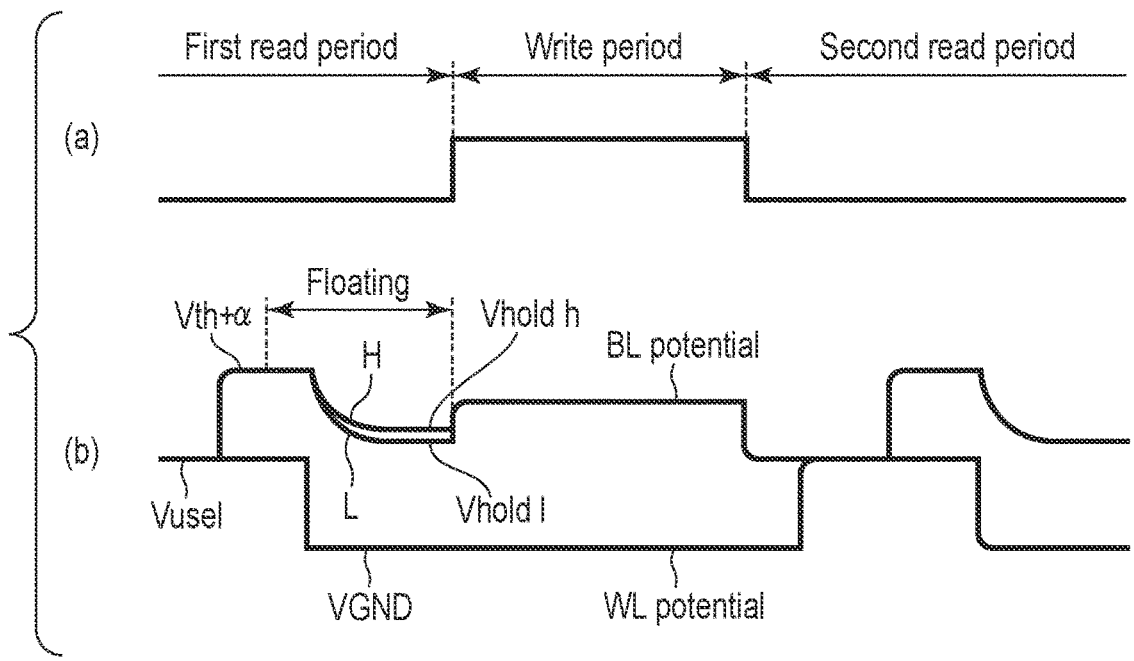
FIG. 6 is a timing diagram showing an operation of self-reference reading, which is the basic principle of a determination operation of the memory device according to the first embodiment.

FIG. 6 is a timing diagram showing an operation of self-reference reading, which is the basic principle of the determination operation of the present embodiment.

FIG. 6(a) shows timings of a first read period, a second read period, and a write period described below. FIG. 6(b) shows potentials of the word line WL and the bit line BL. L is a bit line potential when the magnetoresistance effect element 101 is set to a low resistance state as the determination target resistance state, and H is a bit line potential when the magnetoresistance effect element 101 is set to a high resistance state as the determination target resistance state.

A basic operation of the self-reference reading is described below with reference to FIG. 6. Note that the following is a description on the basic operation of the self-reference reading, and the resistance of the word line WL and the resistance of the bit line BL are ignored.

First, a same voltage Vusel is applied to the word line WL and the bit line BL. The value of the voltage Vusel is about half the value of the threshold voltage Vth described above. At this time, the voltage applied to the memory cell MC is zero.

Next, a voltage slightly higher than the threshold voltage Vth (Vth+α) is applied to the bit line BL. The voltage Vusel is applied to the word line WL.

Next, the bit line BL is set to a floating state. At this time, the voltage of the bit line BL is maintained at (Vth+α).

Next, with the bit line BL maintained in the floating state, a ground voltage (voltage zero) VGND is applied to the word line WL. Thus, a voltage (Vth+α) higher than the threshold voltage Vth is applied between the word line WL and the bit line BL. As a result, the voltage (Vth+α) is applied to the memory cell MC, and the selector 102 in the memory cell MC changes from the off state to the on state.

When the selector 102 changes from the off state to the on state, a current flows between the word line WL and the bit line BL through the memory cell MC. At this time, since the bit line BL is maintained in the floating state, the potential of the bit line BL automatically decreases gradually as the current flows.

When the potential of the bit line BL decreases and the voltage between the word line WL and the bit line BL reaches the hold voltage Vhold (Vholdl or Vholdh shown in FIG. 6), the voltage between both ends of the memory cell MC becomes the hold voltage Vhold and the selector 102 changes from the on state to the off state.

As already mentioned, after the selector 102 changes from the off state to the on state, the voltage between both ends of the memory cell MC differs in accordance with whether the magnetoresistance effect element 101 is in the low resistance state or the high resistance state. That is, the voltage between the word line WL and the bit line BL is different in accordance with whether the magnetoresistance effect element 101 is in the low resistance state or the high resistance state. Therefore, with the bit line BL in the floating state, the voltage applied between the word line WL and the bit line BL is obtained as the determination target voltage at the time when a predetermined time has elapsed from the time when the selector 102 changes from the off state to the on state.

After acquiring the determination target voltage in the first read period as described above, the operation of the write period is performed. In the write period, one of the low resistance state and the high resistance state is set to the magnetoresistance effect element 101 in the memory cell MC as a reference resistance state. Specifically, the reference resistance state is set to magnetoresistance effect element 101 by applying a predetermined voltage between the word line WL and the bit line BL, changing the selector 102 from the off state to the on state, and applying a predetermined write current to the magnetoresistance effect element 101.

After setting the reference resistance state to the magnetoresistance effect element 101 in the write period, the operation of the second read period is performed.

A basic sequence of operations of the second read period is the same as the sequence of operations of the first read period described above.

That is, first, the same voltage Vusel is applied to the word line WL and the bit line BL. Then, the voltage (Vth+α) is applied to the bit line BL, and furthermore, the bit line BL is set to the floating state. Then, while the bit line BL is maintained in the floating state, the ground voltage (voltage zero) is applied to the word line WL. Thus, the voltage (Vth+α) is applied to the memory cell MC, and the selector 102 in the memory cell MC changes from the off state to the on state. As a result, the potential of the bit line BL automatically decreases gradually, and, when the voltage between the word line WL and the bit line BL reaches the hold voltage Vhold, the selector 102 changes from the on state to the off state.

As already mentioned, the selector 102 changes from the off state to the on state in a state where the bit line BL is maintained in the floating state. Therefore, as in the first read operation, the voltage applied between the word line WL and the bit line BL at the time when a predetermined time (the same as the predetermined time in the first read period) elapses from the time when the selector 102 changes from the off state to the on state with the bit line BL in the floating state is acquired as the reference voltage.

If the determination target resistance state, which was set in the magnetoresistance effect element 101 in advance before the first read period, is the same as the reference resistance state set in the magnetoresistance effect element 101 in the write period, the determination target voltage and the reference voltage are substantially the same value. On the other hand, if the determination target resistance state is different from the reference resistance state, the determination target voltage and the reference voltage will be different values. Specifically, the voltage difference between the determination target voltage and the reference voltage is compared with a reference voltage difference (first reference voltage difference) Vdif1, and, if the voltage difference between the determination target voltage and the reference voltage is smaller than the reference voltage difference Vdif1, it is determined that the determination target resistance state is the same as the reference resistance state. If the voltage difference between the determination target voltage and the reference voltage is greater than the reference voltage difference Vdif1, the determination target resistance state is determined to be different from the reference resistance state.

In this way, the determination target resistance state can be determined by comparing the determination target voltage with the reference voltage.

In the determination operation described above, in a case where the determination target resistance state differs from the reference resistance state, the voltage difference between the determination target voltage and the reference voltage varies according to the time from when the selector 102 changes from the off state to the on state until the determination target voltage or the reference voltage is acquired. Therefore, it is desirable to acquire the determination target voltage or the reference voltage at a time when the voltage difference between the determination target voltage and the reference voltage becomes as large as possible in the case where the determination target resistance state is different from the reference resistance state.

The speed at which the potential of the bit line BL (corresponding to the voltage between the word line WL and the bit line BL) attenuates after the selector 102 changes from the off state to the on state varies depending on the memory cell MC. Specifically, the speed at which the potential of the bit line BL attenuates varies depending on a resistance component (parasitic resistance component) R and a capacitance component (parasitic capacitance component) C associated with the memory cell MC. That is, in reality, since a resistance component and a capacitance component exist in the word line WL and the bit line BL, and a resistance component also exists in the memory cell MC, the speed at which the potential of the bit line BL attenuates varies depending on the position of the memory cell MC, etc. in the memory cell array area 10. Therefore, it is preferable to set the timing for acquiring the determination target voltage and the reference voltage according to the RC component associated with the memory cell MC so that the voltage difference between the determination target voltage and the reference voltage becomes larger.

In the present embodiment, the determination operation is performed in the following manner from the above-mentioned perspective.

Figure 7:
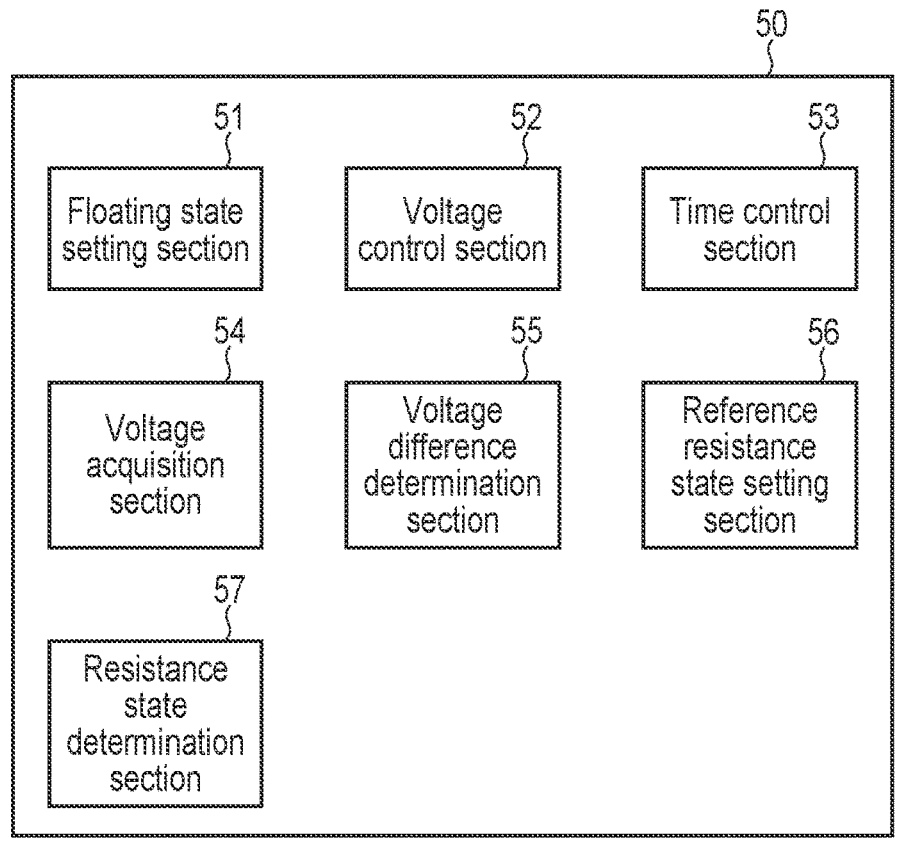
FIG. 7 is a block diagram showing a configuration of a determination operation control circuit of the memory device according to the first embodiment.

FIG. 7 is a block diagram showing a configuration (functional configuration) of the determination operation control circuit 50 shown in FIG. 1.

As shown in FIG. 7, the determination operation control circuit 50 includes a floating state setting section (floating state setting circuit) 51, a voltage control section (voltage control circuit) 52, a time control section (time control circuit) 53, a voltage acquisition section (voltage acquisition circuit) 54, a voltage difference determination section (voltage difference determination circuit) 55, a reference resistance state setting section (reference resistance state setting circuit) 56, and a resistance state determination section (resistance state determination circuit) 57.

Figure 8:
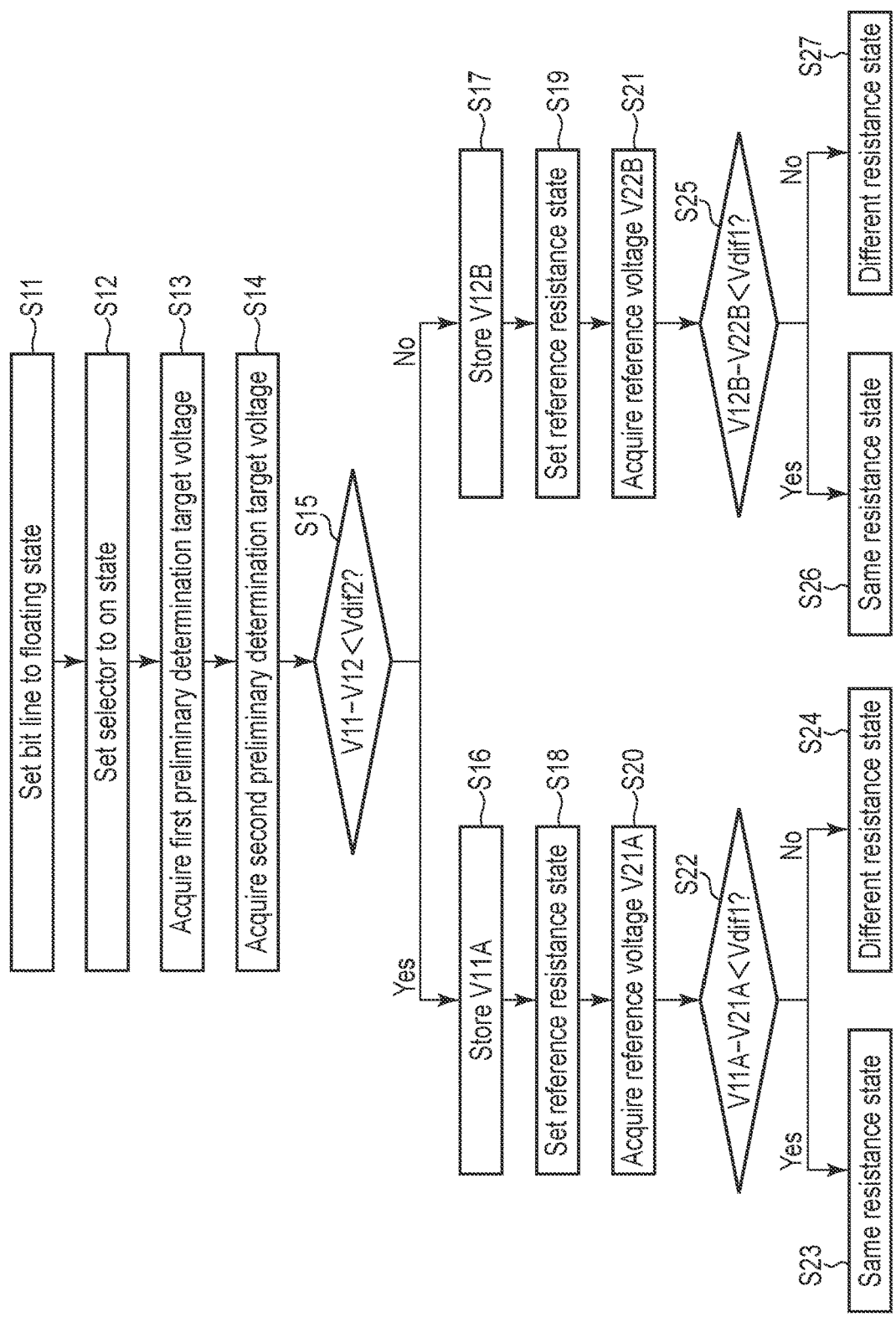
FIG. 8 is a flowchart showing operations performed by the determination operation control circuit of the memory device according to the first embodiment.

FIG. 8 is a flowchart showing operations performed by the determination operation control circuit 50 in the present embodiment.

Figure 9:
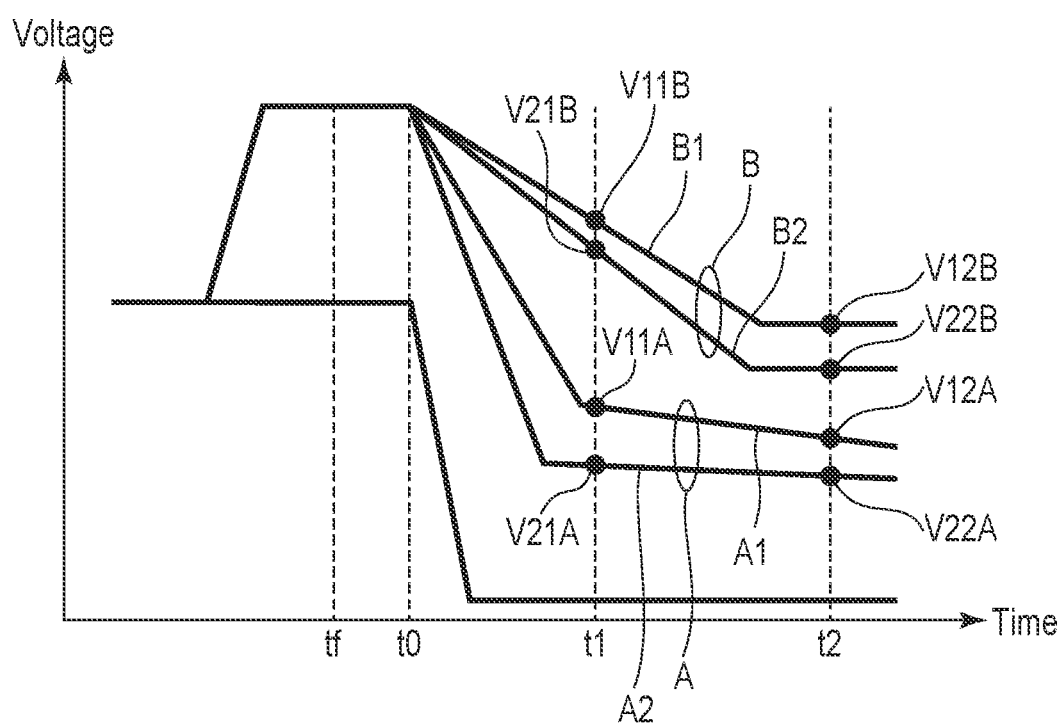
FIG. 9 is a timing diagram showing operations performed by the determination operation control circuit of the memory device according to the first embodiment.

FIG. 9 is a timing diagram showing the operations performed by the determination operation control circuit 50 in the present embodiment. The horizontal axis is time, and the vertical axis is voltage.

In FIG. 9, characteristic A is a bit line voltage (bit line potential) characteristic in a case where the RC component associated with the memory cell MC is small. Characteristic A1 corresponds to a case where the magnetoresistance effect element 101 is set to a high resistance state, and characteristic A2 corresponds to a case where the magnetoresistance effect element 101 is set to a low resistance state. Characteristic B is a bit line voltage (bit line potential) characteristic in a case where the RC component associated with the memory cell MC is large. Characteristic B1 corresponds to a case where the magnetoresistance effect element 101 is set in a high resistance state, and characteristic B2 corresponds to a case where the magnetoresistance effect element 101 is set in a low resistance state. Note that, in reality, the bit line voltage discharge characteristics are as shown in FIG. 6, but, in FIG. 9, they are simplified and shown as straight lines.

The operations of the present embodiment are described below mainly with reference to FIG. 6, FIG. 7, FIG. 8, and FIG. 9.

Note that, in the following description, for simplicity of explanation, in some cases, the selected memory cell MC (memory cell MC to be a reading target) may be simply referred to as a memory cell MC, the word line WL connected to the selected memory cell MC may be simply referred to as a word line WL, and the bit line BL connected to the selected memory cell MC may be simply referred to as a bit line BL.

In the present embodiment, a case in which a high resistance state is set in the magnetoresistance effect element 101 as the determination target resistance state and a low resistance state is set in the magnetoresistance effect element 101 as the reference resistance state will be described. Therefore, characteristics A1 and B1 in FIG. 9 show the bit line voltage in the first read period, and characteristics A2 and B2 in FIG. 9 show the bit line voltage in the second read period. Thus, characteristics A1 and B1 in FIG. 9 and characteristics A2 and B2 in FIG. 9 are originally shown at different positions on the time axis. However, for clarity of explanation, characteristics A1 and B1 and characteristics A2 and B2 are shown at the same position on the time axis.

First, in the first read period, after the voltages shown in FIG. 6 are set to the word line WL and the bit line BL, the bit line BL is set to a floating state at tf in FIG. 9 (S11). That is, the bit line BL is set to the floating state by controlling the bit line selection/drive circuit 30 of FIG. 1 by the floating state setting section 51 of FIG. 7.

Next, in a state where the bit line BL is set to the floating state, the potential (voltage) of the word line WL is changed at t0 (first on-state setting time point). Specifically, by controlling the word line selection/drive circuit 20 by the voltage control section 52, the potential of the word line WL is set to the ground potential (potential zero). As a result, the voltage applied between the word line WL and the bit line BL is increased, and the selector 102 included in the selected memory cell MC is set to the on state (S12).

Next, after a certain time (first preliminary elapsed time) has elapsed from the on-state setting time point t0, at time point t1 (first preliminary determination target voltage acquisition time point) set by the time control section 53, with the bit line BL set to the floating state, the voltage applied between the word line WL and the bit line BL (first preliminary determination target voltage) is acquired by the voltage acquisition section 54 (S13). That is, a voltage V11A (in a case where the RC component is small) or a voltage V11B (in a case where the RC component is large) of the bit line BL is acquired.

Next, after a certain time (second preliminary elapsed time) has elapsed from the first on-state setting time point t0, with the bit line BL set to the floating state, at time point t2 (second preliminary determination target voltage acquisition time point) later than time point t1 set by the time control section 53, the voltage applied between the word line WL and the bit line BL (second preliminary determination target voltage) is acquired by the voltage acquisition section 54 (S14). That is, a voltage V12A (in the case where the RC component is small) or a voltage V12B (in the case where the RC component is large) of the bit line BL is acquired.

Note that, in the following description, the above-mentioned voltages V11A and V11B may be referred to simply as voltage V11, and the above-mentioned voltages V12A and V12B may be referred to simply as voltage V12.

Next, a voltage difference (V11−V12) between the voltages V11 and V12 is compared with a reference voltage difference (second reference voltage difference) Vdif2, and it is determined whether or not the voltage difference (V11−V12) is smaller than the reference voltage difference Vdif2 by the voltage difference determination section 55 (S15).

As shown in FIG. 9, in the case where the RC component is small (characteristic A), the voltage on the bit line BL attenuates relatively fast. In the case where the RC component is large (characteristic B), the voltage on the bit line BL attenuates relatively slow. Therefore, the value of the voltage difference (V11−V12) becomes smaller in the case where the RC component is small (characteristic A) than in the case where the RC component is large (characteristic B).

In the example shown in FIG. 9, in the case where the RC component is small (characteristic A), a difference (V11A−V21A) between the preliminary determination target voltage V11A and a preliminary reference voltage V21A at time point t1 is greater than a difference (V12A−V22A) between the preliminary determination target voltage V12A and a preliminary reference voltage V22A at time point t2. Conversely, in the case where the RC component is large (characteristic B), a difference (V12B−V22B) between the preliminary determination target voltage V12B and a preliminary reference voltage V22B at time point t2 is greater than a difference (V11B−V21B) between the preliminary determination target voltage V11B and a preliminary reference voltage V21B at time point t1.

From the above, in the case of setting the low resistance state as the reference resistance state, in a case where the voltage difference (V11−V12) is smaller than the reference voltage difference Vdif2 (corresponding to characteristic A), the difference (V11A−V21A) between the determination target voltage and the reference voltage is acquired at time point t1. In a case where the voltage difference (V11−V12) is equal to or greater than the reference voltage difference Vdif2 (corresponding to characteristic B), the difference (V12B−V22B) between the determination target voltage and the reference voltage is acquired at time point t2. In this way, the determination target resistance state can be determined with high accuracy.

As described above, in the case where the voltage difference (V11−V12) is smaller than the reference voltage difference Vdif2, t1 is selected as the determination target voltage acquisition time point, the voltage V11A acquired at time point t1 is adopted as the determination target voltage, and the voltage V11A is stored (S16).

Conversely, in a case where the voltage difference (V11−V12) is greater than or equal to the reference voltage difference Vdif2, t2 is selected as the determination target voltage acquisition time point, the voltage V12B acquired at time point t2 is adopted as the determination target voltage, and the voltage V12B is stored (S17). In the manner described above, after the first read period is ended, the operation shifts to the write period of the reference voltage.

In the write period of the reference voltage, the reference resistance state selected from the low resistance state and the high resistance state is set to the magnetoresistance effect element 101 by the reference resistance state setting section 56. In the present example, the low resistance state is set as the reference resistance state (S18, S19).

After the write period of the reference voltage is ended, the operation shifts to the second read period. As already mentioned, the basic read operation of the second read period is the same as that of the first read period.

That is, with the bit line BL set to the floating state, the potential (voltage) of the word line WL is changed to the ground potential (potential zero) at t0 (second on-state setting time point). As a result, the selector 102 included in the selected memory cell MC is set to the on state.

In the case where t1 is selected as the determination target voltage acquisition time point (in a case where S16 is selected), the voltage (reference voltage) applied between the word line WL and the bit line BL is acquired at time point t1 (reference voltage acquisition time point) at which a certain time has elapsed from the on-state setting time point t0, with the bit line BL set to the floating state (S20). That is, the voltage V21A of the bit line BL is acquired.

In the case where t2 is selected as the determination target voltage acquisition time point (in a case where S17 is selected), the voltage (reference voltage) applied between the word line WL and the bit line BL is acquired at time point t2 (reference voltage acquisition time point) at which a certain time has elapsed from the on-state setting time point t0, with the bit line BL set to the floating state (S21). That is, the voltage V22B of the bit line BL is acquired.

As described above, the elapsed time (first elapsed time) from the first on-state setting time point t0 to the determination target voltage acquisition time point (t1 or t2) in the first read period and the elapsed time (second elapsed time) from the second on-state setting time point t0 to the reference voltage acquisition time point (t1 or t2) in the second read period are the same.

The determination target voltage acquisition time point (t1 or t2) in the first read period and the reference voltage acquisition time point (t1 or t2) in the second read period are determined according to the RC component (RC time constant). That is, if toff is a time point at which the selector 102 changes from the on state to the off state, then t0<toff<t1<t2, t0<t1<toff<t2, or t0<t1<t2<toff is established.

Next, based on the determination target voltage and the reference voltage described above, the determination target resistance state that was set in the magnetoresistance effect element 101 in advance before the first read period is determined. That is, the determination target resistance state is determined based on the voltage difference between the determination target voltage and the reference voltage.

In the case where t1 is selected as the determination target voltage acquisition time point (in the case where S16 is selected), the voltage difference (V11A–V21A) between the determination target voltage V11A and the reference voltage V21A is compared with the reference voltage difference Vdif1 (first reference voltage difference) (S22).

In a case where the voltage difference (V11A–V21A) between the determination target voltage V11A and the reference voltage V21A is smaller than the reference voltage difference Vdif1 (in this case, the determination target voltage is substantially V21A), it is determined that the determination target resistance state is the same as the reference resistance state (S23).

In a case where the voltage difference (V11A–V21A) between the determination target voltage V11A and the reference voltage V21A is equal to or greater than the reference voltage difference Vdif1, it is determined that the determination target resistance state is different from the reference resistance state (S24).

In the present embodiment, it is explained that the reference resistance state is a low resistance state, and the determination target resistance state is a high resistance state. Therefore, S24 is selected, and the determination target resistance state is determined to be a high resistance state.

In the case where t2 is selected as the determination target voltage acquisition time point (in the case where S17 is selected), the voltage difference (V12B–V22B) between the determination target voltage V12B and the reference voltage V22B is compared with the reference voltage difference Vdif1 (first reference voltage difference) (S25).

In a case where the voltage difference (V12B–V22B) between the determination target voltage V12B and the reference voltage V22B is smaller than the reference voltage difference Vdif1 (in this case, the determination target voltage is substantially V22B), it is determined that the determination target resistance state is the same as the reference resistance state (S26).

In a case where the voltage difference (V12B–V22B) between the determination target voltage V12B and the reference voltage V22B is equal to or greater than the reference voltage difference Vdif1, it is determined that the determination target resistance state is different from the reference resistance state (S27).

In the present embodiment, it is explained that the reference resistance state is a low resistance state and the determination target resistance state is a high resistance state. Therefore, S27 is selected, and the determination target resistance state is determined to be a high resistance state.

As described above, in the present embodiment, the determination target voltage acquisition time point at which the determination target voltage is acquired in the first read period and the reference voltage acquisition time point at which the reference voltage is acquired in the second read period change (are selected) according to the RC component associated with the selected memory cell MC. Thus, by using the voltage difference between the determination target voltage and the reference voltage acquired at the appropriate time points to determine the determination target resistance state, in a case where the determination target resistance state and the reference resistance state are different, it is possible to acquire the voltage difference between the determination target voltage and the reference voltage at the time points where the voltage difference between the determination target voltage and the reference voltage becomes large. Therefore, it is possible to accurately determine whether the voltage difference between the determination target voltage and the reference voltage is smaller or greater than the reference voltage difference Vdif1, and it is possible to accurately determine the determination target resistance state.

Second Embodiment

Next, a memory device according to a second embodiment will be described. Note that, since the basic matters are the same as those of the first embodiment, the explanation of the matters explained in the first embodiment is omitted.

Since the block diagram of a basic configuration (functional configuration) of a determination operation control circuit 50 in the present embodiment is represented in the same way as the block diagram (FIG. 7) shown in the first embodiment, the drawing is omitted.

Figure 10:
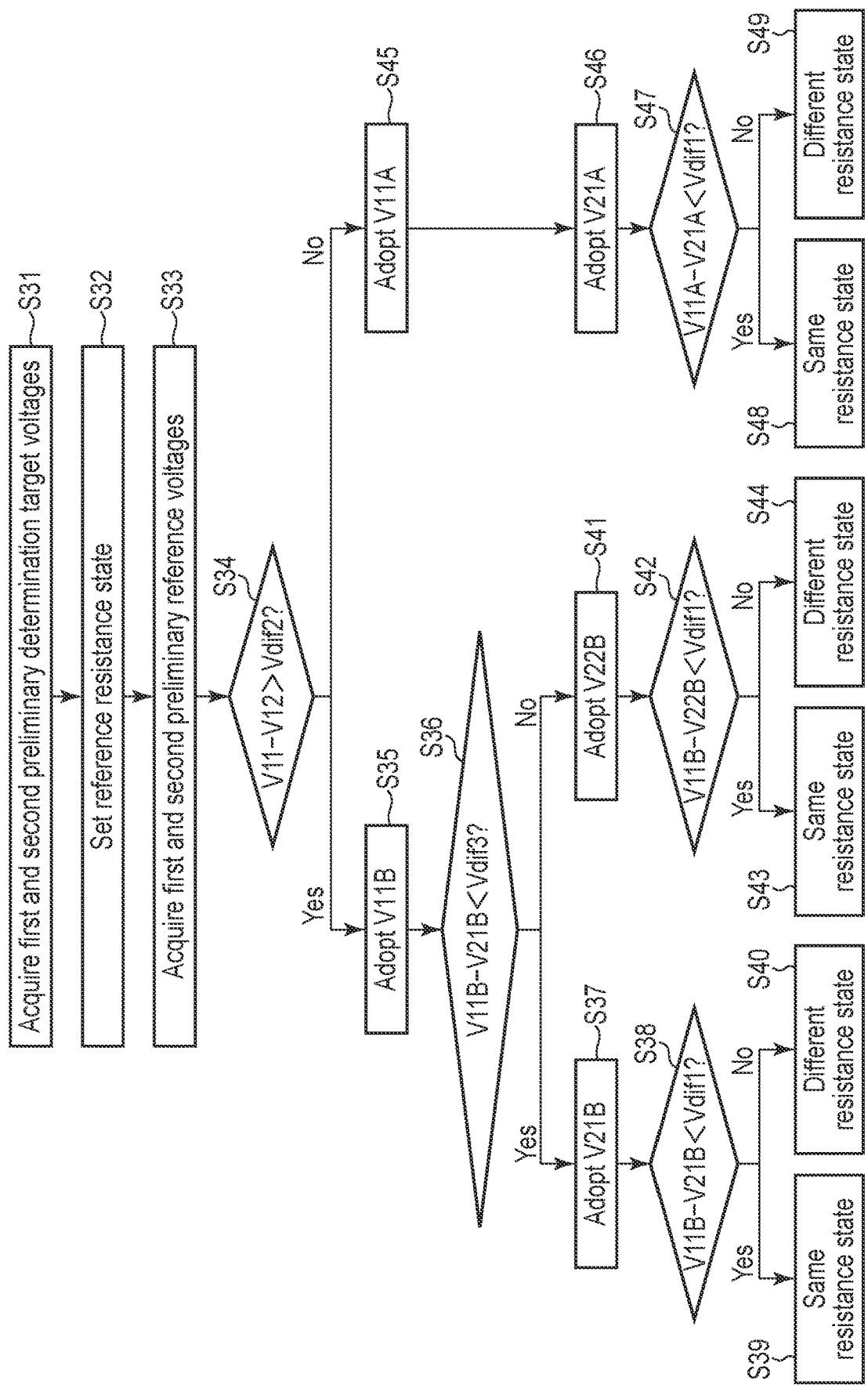
FIG. 10 is a flowchart showing operations performed by a determination operation control circuit of a memory device according to a second embodiment.

FIG. 10 is a flowchart showing operations performed by the determination operation control circuit 50 in the present embodiment.

Figure 11:
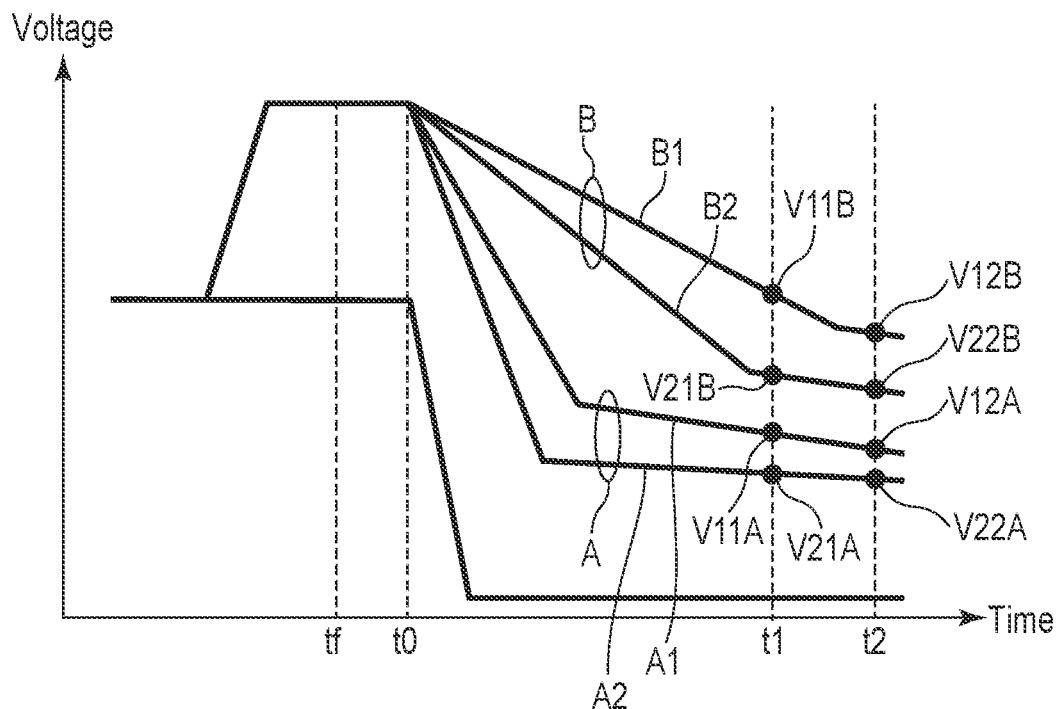
FIG. 11 is a timing diagram showing operations performed by the determination operation control circuit of the memory device according to the second embodiment.

FIG. 11 is a timing diagram showing the operations performed by the determination operation control circuit 50 in the present embodiment. The horizontal axis is time, and the vertical axis is voltage.

In the present embodiment, characteristics A and B shown in FIG. 11 are different from those shown in FIG. 9 of the first embodiment. Operations performed by the determination operation control circuit 50 in the case of the characteristics as shown in FIG. 11 will be described.

Note that, in the present embodiment, as in the first embodiment, the case in which a low resistance state is set as the reference resistance state and a high resistance state is set as the determination target resistance state will be described. Therefore, characteristics A1 and B1 in FIG. 11 show a bit line voltage in a first read period, and characteristics A2 and B2 in FIG. 11 show a bit line voltage in a second read period.

First, in the first read period, the same operation as S11 and S12 of the first embodiment is performed. That is, the bit line BL is set to a floating state at tf in FIG. 11, the voltage of a word line WL is changed to zero at t0 (first on-state setting time point), and a selector 102 is set to an on state.

Next, as in the first embodiment, a first preliminary determination target voltage V11A (in a case where an RC component is small) or V11B (in a case where the RC component is large) is acquired at time point t1 (first preliminary determination target voltage acquisition time point), and a second preliminary determination target voltage V12A (in a case where the RC component is small) or V12B (in a case where the RC component is large) is acquired at time point t2 (second preliminary determination target voltage acquisition time point) (S31).

Note that, also in the present embodiment, the above-mentioned voltages V11A and V11B may be referred to simply as voltage V11, and the above-mentioned voltages V12A and V12B may be referred to simply as voltage V12 in the following description.

Next, the operation shifts to a write period of a reference voltage, and a reference resistance state is set to a magnetoresistance effect element 101 in the same manner as in the first embodiment. In the present embodiment, a low resistance state is set as the reference resistance state (S32).

Next, the operation shifts to a second read period, and a first preliminary reference voltage V21A (in a case where the RC component is small) or V21B (in a case where the RC component is large) is acquired at time point t1 (first preliminary reference voltage acquisition time point), and a second preliminary reference voltage V22A (in a case where the RC component is small) or V22B (in a case where the RC component is large) is acquired at time point t2 (second preliminary reference voltage acquisition time point) (S33).

Next, a voltage difference (V11–V12) between the first preliminary determination target voltage V11 and the second preliminary determination target voltage V12 is compared with a reference voltage difference (second reference voltage difference) Vdif2, and it is determined whether or not the voltage difference (V11–V12) is greater than the reference voltage difference Vdif2 (S34).

In the case where the voltage difference (V11–V12) is greater than the reference voltage difference Vdif2, the RC component is large and corresponds to characteristic B. In this case, the first preliminary determination target voltage acquisition time point t1 is selected as the determination target voltage acquisition time point, and the voltage V11B acquired at time point t1 is adopted as a determination target voltage (S35).

Next, a voltage difference (V11B–V21B) is compared with a reference voltage difference Vdif3 to determine whether or not the voltage difference (V11B–V21B) is smaller than the reference voltage difference Vdif3 (S36). That is, the voltage difference (V11B–V21B) between the preliminary determination target voltage V11B acquired at time point t1 and the preliminary reference voltage V21B acquired at time point t1 is compared with the reference voltage difference Vdif3.

In a case where the voltage difference (V11B–V21B) is smaller than the reference voltage difference Vdif3, the voltage V21B acquired at time point t1 is adopted as the reference voltage (S37).

Next, the voltage difference (V11B–V21B) between the determination target voltage V11B and the reference voltage V21B is compared with a reference voltage difference Vdif1 (first reference voltage difference) (S38).

In a case where the voltage difference (V11B–V21B) between the determination target voltage V11B and the reference voltage V21B is smaller than the reference voltage difference Vdif1 (in this case, the determination target voltage is substantially V21B), it is determined that the determination target resistance state is the same as the reference resistance state (S39).

In a case where the voltage difference between the determination target voltage V11B and the reference voltage V21B (V11B–V21B) is equal to or greater than the reference voltage difference Vdif1, it is determined that the determination target resistance state is different from the reference resistance state (S40).

In a case where the voltage difference (V11B–V21B) is determined to be equal to or greater than the reference voltage difference Vdif3 in S36, the voltage V22B acquired at time point t2 is adopted as the reference voltage (S41).

Next, a voltage difference (V11B–V22B) between the determination target voltage V11B and the reference voltage V22B is compared with the reference voltage difference Vdif1 (first reference voltage difference) (S42).

In a case where the voltage difference (V11B–V22B) between the determination target voltage V11B and the reference voltage V22B is smaller than the reference voltage difference Vdif1 (in this case, the determination target voltage is substantially V21B), it is determined that the determination target resistance state is the same as the reference resistance state (S43).

In a case where the voltage difference (V11B–V22B) between the determination target voltage V11B and the reference voltage V22B is equal to or greater than the reference voltage difference Vdif1, it is determined that the determination target resistance state is different from the reference resistance state (S44).

The reason for performing the determination operation as described above is explained.

In a case where the voltage difference (V11B–V21B) is equal to or greater than the reference voltage difference Vdif3, it is highly likely that the determination target resistance state is different from the reference resistance state. As shown in FIG. 11, in the case where the determination target resistance state is different from the reference resistance state, the difference (V11B–V22B) between the determination target voltage V11B acquired at time point t1 and the reference voltage V22B acquired at time point t2 becomes the largest. Therefore, by comparing the voltage difference (V11B–V22B) with the reference voltage difference Vdif1, it can be determined with high probability that the determination target voltage is different from the reference voltage.

On the other hand, in a case where the voltage difference (V11B–V21B) is smaller than the reference voltage difference Vdif3, the determination target resistance state is highly likely to be the same as the reference resistance state. In this case, if the determination target voltage V21B acquired at time point t1 and the reference voltage V22B acquired at time point t2 are adopted, the voltage difference (V21B–V22B) has some magnitude, as shown in FIG. 11. Therefore, if the voltage difference (V21B–V22B) is compared with the reference voltage difference Vdif1, there is a possibility that the determination target resistance state will be incorrectly determined to be different from the reference resistance state. Therefore, by comparing the difference between the determination target voltage acquired at time point t1 and the reference voltage acquired at time point t1 with the reference voltage difference Vdif1, it can be determined with high probability that the determination target voltage is the same as the reference voltage.

In a case where the voltage difference (V11–V12) is determined to be less than or equal to the reference voltage difference Vdif2 in S34, the RC component is small and corresponds to characteristic A. In this case, the first preliminary determination target voltage acquisition time point t1 is selected as the determination target voltage acquisition time point, and the voltage V11A acquired at time point t1 is adopted as the determination target voltage (S45). Also, the voltage V21A acquired at time point t1 is adopted as the reference voltage (S46).

Next, a voltage difference (V11A–V21A) between the determination target voltage V11A and the reference voltage V21A is compared with the reference voltage difference Vdif1 (first reference voltage difference) (S47).

In a case where the voltage difference (V11A–V21A) between the determination target voltage V11A and the reference voltage V21A is smaller than the reference voltage difference Vdif1 (in this case, the determination target voltage is substantially V21A), it is determined that the determination target resistance state is the same as the reference resistance state (S48).

In a case where the voltage difference (V11A−V21A) between the determination target voltage V11A and the reference voltage V21A is equal to or greater than the reference voltage difference Vdif1, it is determined that the determination target resistance state is different from the reference resistance state (S49).

Note that, also in the present embodiment, it is explained that the reference resistance state is a low resistance state, and the determination target resistance state is a high resistance state. Therefore, S40, S44 or S49 is selected, and the determination target resistance state is determined to be a high resistance state.

In the present embodiment, as in the first embodiment, the determination target voltage acquisition time point and the reference voltage acquisition time point change (are selected) according to the RC component associated with the selected memory cell MC. Therefore, in the present embodiment, as in the first embodiment, it is possible to accurately determine the determination target resistance state.

In the present embodiment, in a case where the RC component is large and the determination target resistance state is expected to be different from the reference resistance state, the determination target voltage is acquired at time point t1, and the reference voltage is acquired at time point t2, which allows the determination target resistance state more accurately.

Third Embodiment

Next, a memory device according to a third embodiment will be described. Note that, since the basic matters are the same as those of the first embodiment, the explanation of the matters described in the first embodiment is omitted.

Since the block diagram of a basic configuration (functional configuration) of a determination operation control circuit 50 and the timing diagram of basic operations performed by the determination operation control circuit 50 in the present embodiment are represented in the same way as the block diagram (FIG. 7) and the timing diagram (FIG. 9) shown in the first embodiment, the drawings are omitted.

Figure 12:
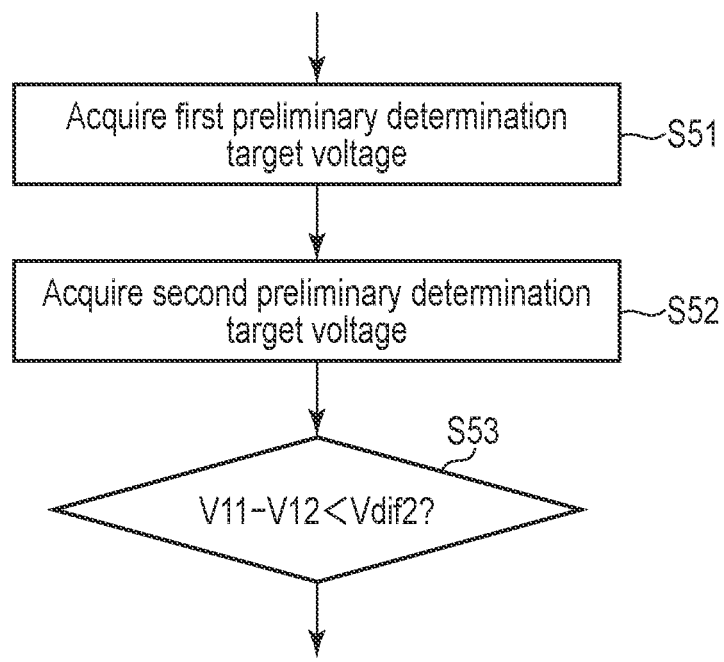
FIG. 12 is a flowchart showing operations performed by a determination operation control circuit of a memory device according to a third embodiment.

FIG. 12 is a flowchart showing the operations performed by the determination operation control circuit 50 in the present embodiment. The flowchart in FIG. 12 shows only the parts that differ from the flowchart of the first embodiment (FIG. 8).

First, in a first subperiod of a first read period, a first preliminary determination target voltage is acquired (S51). Specifically, the first preliminary determination target voltage (V11A or V11B) is acquired at time point t1 (first preliminary determination target voltage acquisition time point) in the same manner as the operations of S11, S12 and S13 in FIG. 8 of the first embodiment.

Next, in a second subperiod of the first read period, a second preliminary determination target voltage is acquired (S52). Specifically, the second preliminary determination target voltage (V12A or V12B) is acquired at time point t2 (second preliminary determination target voltage acquisition time point) in the same manner as the operations of S11, S12 and S14 in FIG. 8 of the first embodiment.

The second subperiod is a period after the first subperiod. That is, after the operations of S11, S12, and S13 in FIG. 8 are performed in the first subperiod to acquire the first preliminary determination target voltage, the operations of S11, S12, and S14 in FIG. 8 are performed in the second subperiod to acquire the second preliminary determination target voltage. Therefore, in the present embodiment, two read periods (first and second subperiods) are substantially provided in the first read period.

Next, a voltage difference (V11−V12) between the voltages V11 and V12 is compared with a reference voltage difference (second reference voltage difference) Vdif2 (S53) in the same manner as in the operation of S15 in FIG. 8 of the first embodiment.

Subsequent operations are the same as those of S16 to S27 in FIG. 8 of the first embodiment, and it is finally determined whether a determination target resistance state is a low resistance state or a high resistance state.

In the present embodiment, as in the first embodiment, a determination target voltage acquisition time point and a reference voltage acquisition time point change (are selected) according to an RC component associated with a selected memory cell MC. Therefore, in the present embodiment, as in the first embodiment, it is possible to accurately determine the determination target resistance state.

Fourth Embodiment

Next, a memory device according to a fourth embodiment will be described. Note that, since the basic matters are the same as those of the first embodiment, the explanation of the matters described in the first embodiment is omitted.

Figure 13:
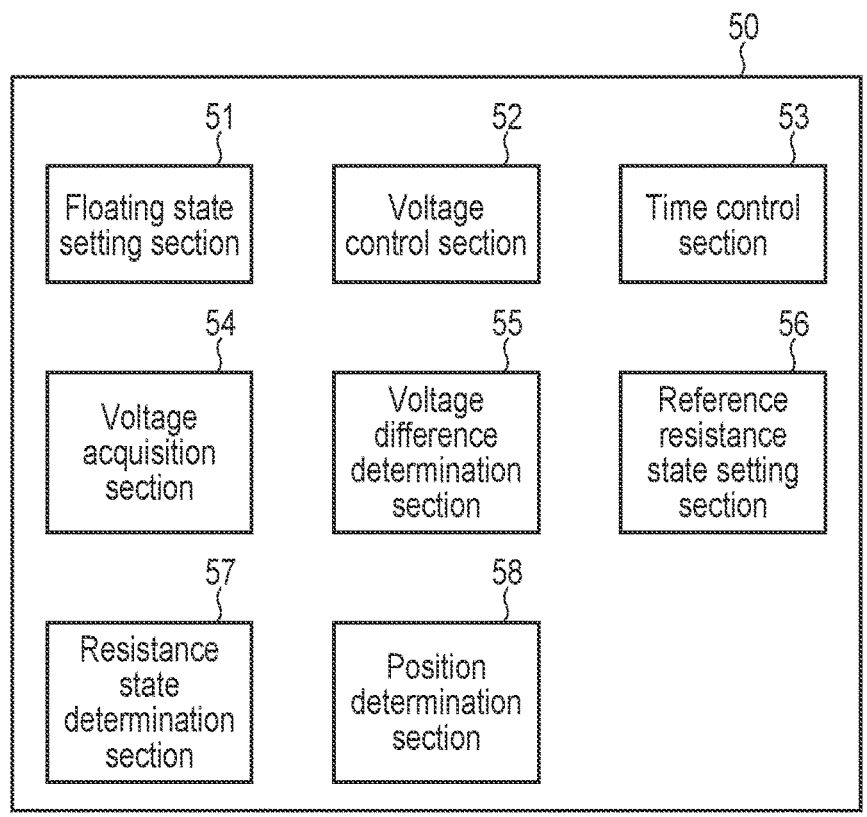
FIG. 13 is a block diagram showing a configuration of a determination operation control circuit of a memory device according to a fourth embodiment.

FIG. 13 is a block diagram showing a basic configuration (functional configuration) of a determination operation control circuit 50 in the present embodiment.

Since a timing diagram of basic operations performed by the determination operation control circuit 50 is represented in the same way as the timing diagram shown in the first embodiment (FIG. 9), the drawing is omitted.

Figure 14:
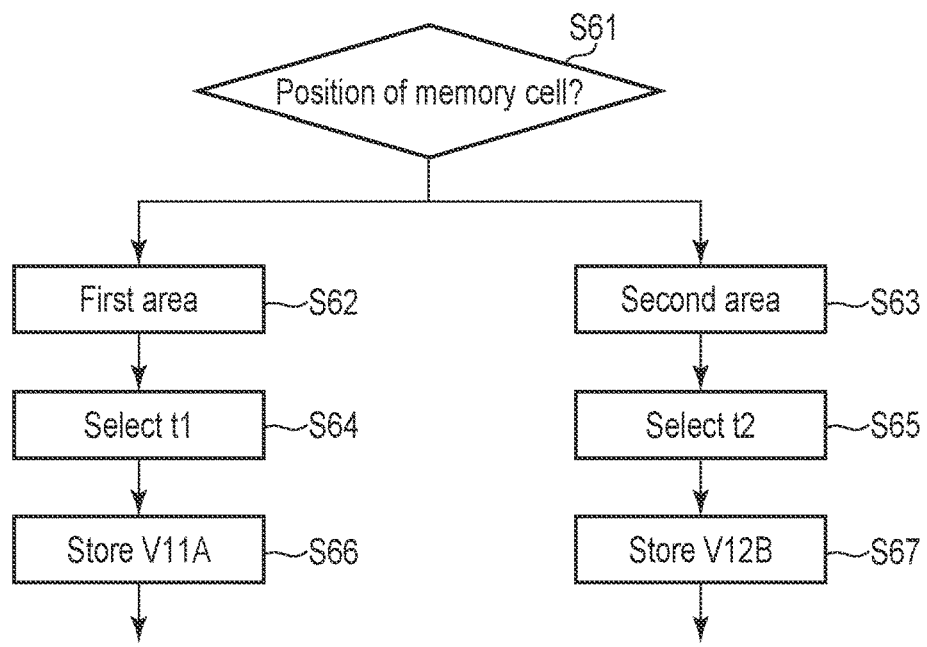
FIG. 14 is a flowchart showing operations performed by the determination operation control circuit of the memory device according to the fourth embodiment.

FIG. 14 is a flowchart showing the operations performed by the determination operation control circuit 50 in the present embodiment. Note that the flowchart in FIG. 14 shows only the parts that differ from the flowchart of the first embodiment (FIG. 8).

Figure 15:
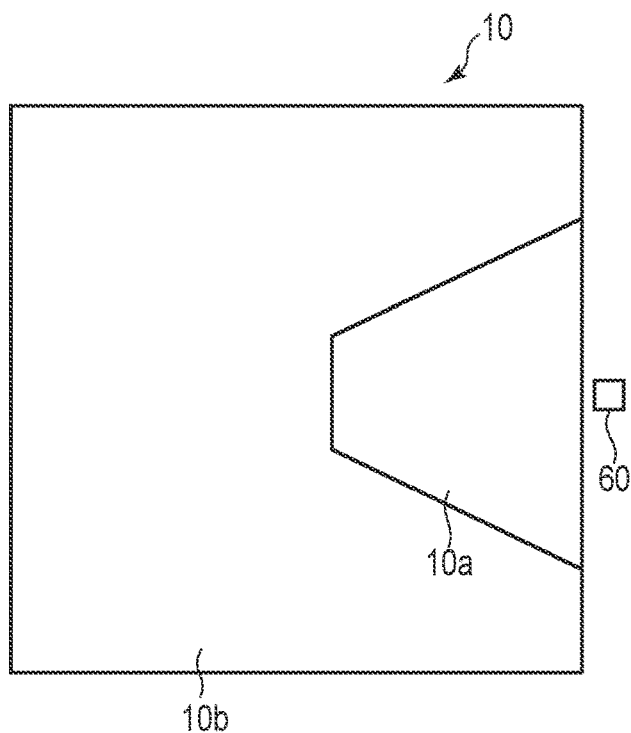
FIG. 15 schematically shows a positional relationship between a memory cell array area and a voltage detecting portion in the memory device according to the fourth embodiment.

In the present embodiment, in a first read period, the position of the memory cell MC is first determined by a position determination section 58 in FIG. 13 (S61). That is, the position of a selected memory cell MC in a memory cell array area 10 in FIG. 1 is determined. In the present embodiment, as shown in FIG. 15, the memory cell array area 10 includes a first area 10a and a second area 10b. As shown in FIG. 15, the first area 10a and the second area 10b are determined based on the distance from a voltage detecting portion (voltage detection circuit) 60 that detects a determination target voltage and a reference voltage. The first area 10a has a relatively short distance from the voltage detecting portion 60, while the second area 10b has a relatively long distance from the voltage detecting portion 60. In the position determination section 58, it is determined whether the selected memory cell MC is contained in the first area 10a or the second area 10b.

As can be seen from the above description, an RC component is smaller in a case where the distance from the voltage detecting portion 60 to the selected memory cell MC is shorter (in a case where the selected memory cell MC is included in the first area 10a) than in a case where the distance from the voltage detecting portion 60 to the selected memory cell MC is longer (in a case where the selected memory cell MC is included in the second area 10b). That is, the characteristic in a case where the selected memory cell MC is included in the first area 10a roughly corresponds to characteristic A in FIG. 9, and the characteristic in a case where the selected memory cell MC is included in the second area 10b roughly corresponds to characteristic B in FIG. 9.

Therefore, in the present embodiment, depending on the distance from the voltage detecting portion 60 to the selected memory cell MC, that is, depending on the area (first area 10a or second area 10b) in which the selected memory cell MC is included, a determination target voltage acquisition time point (t1 or t2) in the first read period and a reference voltage acquisition time point (t1 or t2) in a second read period are determined (S62, S63).

In a case where the selected memory cell MC is included in the first area 10a (S62), time point t1 is selected as the determination target voltage acquisition time point and the reference voltage acquisition time point (S64).

In a case where the selected memory cell MC is included in the second area 10b (S63), time point t2 is selected as the determination target voltage acquisition time point and the reference voltage acquisition time point (S65).

In the case where the operations of S62 and S64 are performed, a voltage V11A acquired at time point t1 is adopted as the determination target voltage, and the voltage V11A is stored (S66).

In the case where the operations of S63 and S65 are performed, a voltage V12B acquired at time point t2 is adopted as the determination target voltage, and the voltage V12B is stored (S67).

Subsequent operations are the same as those of S18 to S27 in FIG. 8 of the first embodiment, and it is finally determined whether a determination target resistance state is a low resistance state or a high resistance state.

In the present embodiment, as in the first embodiment, the determination target voltage acquisition time point and the reference voltage acquisition time point change (are selected) according to the RC component associated with the selected memory cell MC. Therefore, in the present embodiment, as in the first embodiment, it is possible to accurately determine the determination target resistance state.

In addition, in the present embodiment, since the determination target voltage acquisition time point and reference voltage acquisition time point are determined in advance according to the position of the selected memory cell MC, it is possible to reduce the number of times the voltage is acquired.

In the embodiment described above, two areas (first area 10a and second area 10b) are set in the memory cell array area 10, and two time points (t1 and t2) are set as the voltage acquisition time points (determination target voltage acquisition time point and reference voltage acquisition time point); however, it is also possible to set three or more areas in the memory cell array area 10 and set three or more voltage acquisition time points according to the distance from the voltage detecting portion 60.

Fifth Embodiment

Next, a memory device according to a fifth embodiment will be described. Note that, since the basic matters are the same as those of the first embodiment, the explanation of the matters described in the first embodiment is omitted.

Figure 16:
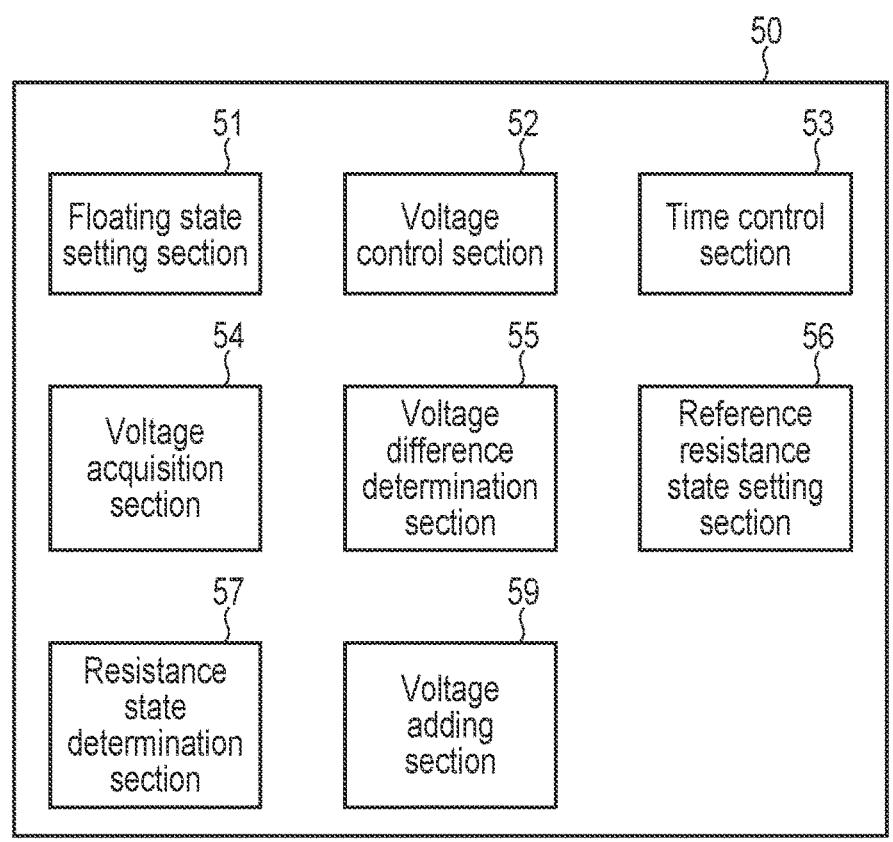
FIG. 16 is a block diagram showing a configuration of a determination operation control circuit of a memory device according to a fifth embodiment.

FIG. 16 is a block diagram showing a basic configuration (functional configuration) of a determination operation control circuit 50 in the present embodiment.

Since a timing diagram of basic operations performed by the determination operation control circuit 50 is represented in the same way as the timing diagram shown in the first embodiment (FIG. 9), the drawing is omitted.

Figure 17:
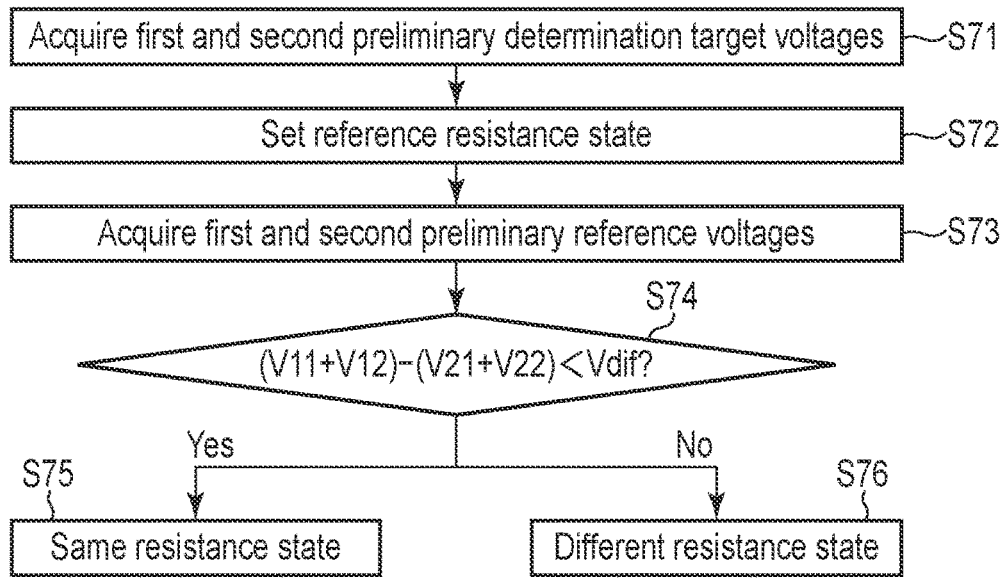
FIG. 17 is a flowchart showing operations performed by the determination operation control circuit of the memory device according to the fifth embodiment.

FIG. 17 is a flowchart showing operations performed by the determination operation control circuit 50 in the present embodiment.

First, in a first read period, a first preliminary determination target voltage V11 and a second preliminary determination target voltage V12 are acquired (S71). The basic operation at this time is the same as the operations of S11 to S14 described in FIG. 8 of the first embodiment. That is, the first preliminary determination target voltage V11 (V11A or V11B) is acquired at a first preliminary determination target voltage acquisition time point t1 at which a first elapsed time has elapsed from an on-state setting time point t0, and the second preliminary determination target voltage V12 (V12A or V12B) is acquired at a second preliminary determination target voltage acquisition time point t2 at which a second elapsed time (an elapsed time different from the first elapsed time) has elapsed from the on-state setting time point t0.

Next, the operation shifts to a write period of a reference voltage, and a reference resistance state is set to a magnetoresistance effect element 101 (S72). The basic operation at this time is the same as those of S18 and S19 described in FIG. 8 of the first embodiment.

Next, the operation shifts to a second read period, and a first preliminary reference voltage V21 and a second preliminary reference voltage V22 are acquired (S73). The basic operation at this time is the same as those of S20 and S21 described in FIG. 8 of the first embodiment. However, unlike the first embodiment, in the present embodiment, the first preliminary reference voltage V21 (V21A or V21B) is acquired at the first preliminary reference voltage acquisition time point t1 where the first elapsed time has elapsed from the on-state setting time point t0, and the second preliminary reference voltage V22 (V22A or V22B) is acquired at the second preliminary reference voltage acquisition time point t2 where the second elapsed time has elapsed from the on-state setting time point t0. That is, both the first preliminary reference voltage V21 and the second preliminary reference voltage V22 are acquired.

Next, a voltage adding section (voltage adding circuit) 59 adds the first preliminary determination target voltage V11 and the second preliminary determination target voltage V12, and the first preliminary reference voltage V21 and the second preliminary reference voltage V22. Based on a voltage difference between the determination target voltage (V11+V12) and the reference voltage (V21+V22) thus obtained, a determination target resistance state is determined. Specifically, it is determined whether or not the voltage difference (V11+V12)−(V21+V22) between the determination target voltage (V11+V12) and the reference voltage (V21+V22) is smaller than a reference voltage difference Vdif by a voltage difference determination section 55 (S74).

In a case where the voltage difference (V11+V12)−(V21+V22) is smaller than the reference voltage difference Vdif, the determination target resistance state is determined to be the same as the reference resistance state (S75). In a case where the voltage difference (V11+V12)−(V21+V22) is equal to or greater than the reference voltage difference Vdif, the determination target resistance state is determined to be different from the reference resistance state (S76).

As described above, in the present embodiment, the determination target resistance state is determined based on the voltage difference between the determination target voltage (V11+V12) obtained by adding the first preliminary determination target voltage V11 and the second preliminary determination target voltage V12, and the reference voltage (V21+V22) obtained by adding the first preliminary reference voltage V21 and the second preliminary reference voltage V22.

Therefore, as shown in characteristic B in FIG. 9, even if the voltage difference (V11−V21) at time point t1 is small, if the voltage difference (V12−V22) at time point t2 is large, the voltage difference between the determination target voltage (V11+V12) and the reference voltage (V21+V22) can be increased to some extent. As shown characteristic A in FIG. 9, even if the voltage difference (V12−V22) at time point t2 is small, if the voltage difference (V11−V21) at time point t1 is large, the voltage difference between the determination target voltage (V11+V12) and the reference voltage (V21+V22) can be increased to some extent. Particularly, in a case where the off characteristic of a memory cell MC is insufficient, there is a high possibility that the voltage difference (V12−V22) at time point t2 may be small as shown in characteristic A in FIG. 9; however, by obtaining the voltage difference (V11−V21) at time point t1 as well, the voltage difference between the determination target voltage (V11+V12) and the reference voltage (V21+V22) can be increased. Therefore, in the present embodiment, it is possible to determine the determination target resistance state with a certain degree of accuracy or higher.

In addition, in the present embodiment, the voltage difference between the determination target voltage and the reference voltage is acquired without performing the determination operation as in S15 of FIG. 8 in the first embodiment. Therefore, it is possible to simplify the operation (steps) until the determination target resistance state is determined.

Thus, in the present embodiment, it is possible to determine the determination target resistance state with a simple operation and with a certain degree of accuracy or higher.

Figure 18:
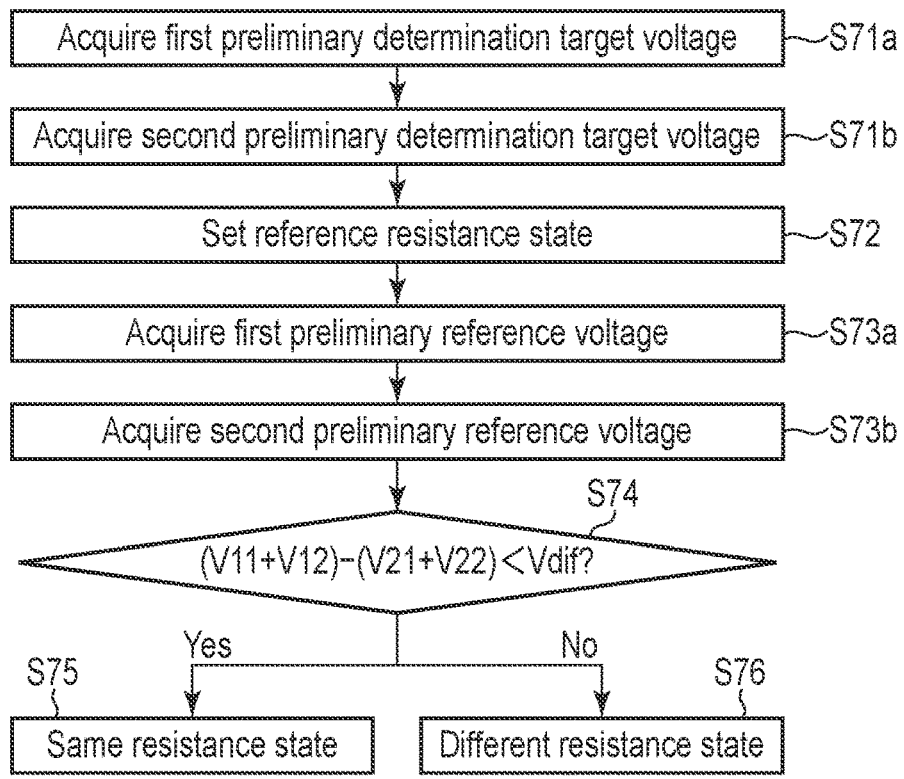
FIG. 18 is a flowchart showing operations performed by a determination operation control circuit of a memory device according to a modified example of the fifth embodiment.

FIG. 18 is a flowchart showing the operation of a modified example of the present embodiment.

First, in a first subperiod of the first read period, the first preliminary determination target voltage V11 is acquired at the first preliminary determination target voltage acquisition time point t1 (S71a). That is, in the first subperiod, the first preliminary determination target voltage V11 is acquired at the first preliminary determination target voltage acquisition time point t1 at which the first elapsed time has elapsed from the on-state setting time point t0.

Next, in a second subperiod of the first read period, the second preliminary determination target voltage V12 is acquired at the second preliminary determination target voltage acquisition time point t2 (S71b). That is, in the second subperiod, the second preliminary determination target voltage V12 is acquired at the second preliminary determination target voltage acquisition time point t2 at which the second elapsed time (elapsed time different from the first elapsed time) has elapsed from the on-state setting time point t0.

The first and second subperiods are different periods of time, and the second subperiod is the period after the first subperiod. Therefore, in the present embodiment, two read periods (first and second subperiods) are substantially provided in the first read period.

Next, the operation shifts to the write period of the reference voltage and, in the same manner as the operation of S72 in FIG. 17 of the embodiment described above, sets the reference resistance state to the magnetoresistance effect element 101 (S72).

Next, the operation shifts to the second read period. In the second read period, first, in a third subperiod, the first preliminary reference voltage V21 is acquired at the first preliminary reference voltage acquisition time point t1 (S73a). That is, in the third subperiod, the first preliminary reference voltage V21 is acquired at the first preliminary reference voltage acquisition time point t1 at which the first elapsed time has elapsed from the on-state setting time point t0.

Next, in a fourth subperiod of the second read period, the second preliminary reference voltage V22 is acquired at the second preliminary reference voltage acquisition time point t2 (S73b). That is, in the fourth subperiod, the second preliminary reference voltage V22 is acquired at the second preliminary reference voltage acquisition time point t2 at which the second elapsed time has elapsed from the on-state setting time point t0.

The third and fourth subperiods are different periods of time, and the fourth subperiod is the period after the third subperiod. Therefore, in the present embodiment, two read periods (third and fourth subperiods) are substantially provided in the second read period.

Thereafter, the determination target resistance state is determined in the same manner as the operations of S74, S75, and S76 in FIG. 17 of the embodiment described above (S74, S75, S76).

In the present modified example, as in the embodiment described above, it is possible to determine the determination target resistance state with a simple operation and with a certain degree of accuracy or higher.

Note that, in the first to fifth embodiments described above, a magnetoresistance effect element was used as a resistance change memory element. However, other resistance change memory elements can be used as long as they are elements that store data based on the resistance state (low resistance state or high resistance state).

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory device comprising:
   a plurality of first wiring lines, each extending in a first direction;
   a plurality of second wiring lines, each extending in a second direction intersecting the first direction;
   a plurality of memory cells connected between the plurality of first wiring lines and the plurality of second wiring lines, each of which includes a resistance change memory element capable of exhibiting a first resistance state and a second resistance state having a higher resistance than that of the first resistance state, and a switching element connected in series with the resistance change memory element and having a characteristic of changing from an off state to an on state when a voltage applied between two terminals thereof increases and reaches a first voltage, and changing from an on state to an off state when a voltage applied between the two terminals decreases and reaches a second voltage that is lower than the first voltage; and
   a determination operation control circuit that controls a determination operation of a resistance state of the resistance change memory element included in a selected memory cell of the plurality of memory cells connected between a selected first wiring line of the plurality of first wiring lines and a selected second wiring line of the plurality of second wiring lines, wherein the determination operation control circuit is configured to:

during a first read period, set the switching element included in the selected memory cell to an on state by changing a voltage of the selected first wiring line at a first on-state setting time point while the selected second wiring line is set to a floating state, and acquire a determination target voltage applied between the selected first wiring line and the selected second wiring line at a determination target voltage acquisition time point at which a first elapsed time has elapsed from the first on-state setting time point;

during a write period after the first read period, set a reference resistance state selected from the first resistance state and the second resistance state to the resistance change memory element included in the selected memory cell;

during a second read period after the write period, set the switching element included in the selected memory cell to an on state by changing a voltage of the selected first wiring line at a second on-state setting time point while the selected second wiring line is set to a floating state, and acquire a reference voltage applied between the selected first wiring line and the selected second wiring line at a reference voltage acquisition time point at which a second elapsed time has elapsed from the second on-state setting time point; and determine, based on a voltage difference between the determination target voltage and the reference voltage, a determination target resistance state that was set in the resistance change memory element included in the selected memory cell prior to the first read period, and the determination target voltage acquisition time point and the reference voltage acquisition time point vary according to the selected memory cell.

2. The memory device of claim 1, wherein
the determination target voltage acquisition time point and the reference voltage acquisition time point depend on a resistance component and a capacitance component associated with the selected memory cell.

3. The memory device of claim 1, wherein
the determination operation control circuit is configured to determine that the determination target resistance state is the same as the reference resistance state in a case where the voltage difference between the determination target voltage and the reference voltage is smaller than a first reference voltage difference, and determine that the determination target resistance state is different from the reference resistance state in a case where the voltage difference between the determination target voltage and the reference voltage is equal to or greater than the first reference voltage difference.

4. The memory device of claim 1, wherein
a length of the second elapsed time is the same as a length of the first elapsed time.

5. The memory device of claim 1, wherein
the determination operation control circuit is configured to select, as the determination target voltage acquisition time point, one of a first preliminary determination target voltage acquisition time point at which a first preliminary elapsed time has elapsed from the first on-state setting time point and a second preliminary determination target voltage acquisition time point at which a second preliminary elapsed time that is longer than the first preliminary elapsed time has elapsed from the first on-state setting time point.

6. The memory device of claim 5, wherein
the determination operation control circuit is configured to:

during the first read period, acquire a first preliminary determination target voltage applied between the selected first wiring line and the selected second wiring line at the first preliminary determination target voltage acquisition time point, and acquire a second preliminary determination target voltage applied between the selected first wiring line and the selected second wiring line at the second preliminary determination target voltage acquisition time point; and select, based on a voltage difference between the first preliminary determination target voltage and the second preliminary determination target voltage, one of the first preliminary determination target voltage acquisition time point and the second preliminary determination target voltage acquisition time point as the determination target voltage acquisition time point.

7. The memory device of claim 6, wherein
the determination operation control circuit is configured to select the first preliminary determination target voltage acquisition time point as the determination target voltage acquisition time point in a case where the voltage difference between the first preliminary determination target voltage and the second preliminary determination target voltage is smaller than a second reference voltage difference, and select the second preliminary determination target voltage acquisition time point as the determination target voltage acquisition time point in a case where the voltage difference between the first preliminary determination target voltage and the second preliminary determination target voltage is equal to or greater than the second reference voltage difference.

8. The memory device of claim 6, wherein
the determination operation control circuit is configured to:

during the second read period, acquire a first preliminary reference voltage applied between the selected first wiring line and the selected second wiring line at a first preliminary reference voltage acquisition time point at which the first preliminary elapsed time has elapsed from the second on-state setting time point, and acquire a second preliminary reference voltage applied between the selected first wiring line and the selected second wiring line at a second preliminary reference voltage acquisition time point at which the second preliminary elapsed time has elapsed from the second on-state setting time point;

make a first selection to select the first preliminary determination target voltage acquisition time point as the determination target voltage acquisition time point in a case where the voltage difference between the first preliminary determination target voltage and the second preliminary determination target voltage is greater than a second reference voltage difference; and in a case where the first selection is made, select the first preliminary reference voltage acquisition time point as the reference voltage acquisition time point in a case where a voltage difference between the first preliminary determination target voltage and the first preliminary reference voltage is smaller than a third reference voltage difference, and select the second preliminary reference voltage acquisition time point as the reference voltage acquisition time point in a case where the voltage difference between the first preliminary determination target voltage and the first preliminary reference voltage is equal to or greater than the third reference voltage difference.

9. The memory device of claim 1, wherein
the determination operation control circuit is configured to:
during a first subperiod of the first read period, set the switching element included in the selected memory cell to an on state by changing a voltage of the selected first wiring line at a first preliminary on-state setting time point while the selected second wiring line is set to a floating state, and acquire a first preliminary determination target voltage applied between the selected first wiring line and the selected second wiring line at a first preliminary determination target voltage acquisition time point at which a first preliminary elapsed time has elapsed from the first preliminary on-state setting time point;
during a second subperiod of the first read period, set the switching element included in the selected memory cell to an on state by changing a voltage of the selected first wiring line at a second preliminary on-state setting time point while the selected second wiring line is set to a floating state, and acquire a second preliminary determination target voltage applied between the selected first wiring line and the selected second wiring line at a second preliminary determination target voltage acquisition time point at which a second preliminary elapsed time has elapsed from the second preliminary on-state setting time point; and
select, based on a voltage difference between the first preliminary determination target voltage and the second preliminary determination target voltage, one of the first preliminary determination target voltage acquisition time point and the second preliminary determination target voltage acquisition time point as the determination target voltage acquisition time point.

10. The memory device of claim 1, wherein
the determination operation control circuit is configured to determine the determination target voltage acquisition time point and the reference voltage acquisition time point based on a position of the selected memory cell in a memory cell array area where the plurality of memory cells are provided.

11. The memory device of claim 10, wherein
the determination operation control circuit is configured to determine the determination target voltage acquisition time point and the reference voltage acquisition time point based on a distance from a voltage detecting portion detecting the determination target voltage and the reference voltage to the position of the selected memory cell.

12. The memory device of claim 11, wherein
a length of the first elapsed time and a length of the second elapsed time each are longer in a case where the distance from the voltage detecting portion to the position of the selected memory cell is longer than in a case where the distance from the voltage detecting portion to the position of the selected memory cell is shorter.

13. The memory device of claim 1, wherein
the resistance change memory element is a magnetoresistance effect element.

14. A memory device comprising:
a plurality of first wiring lines, each extending in a first direction;
a plurality of second wiring lines, each extending in a second direction intersecting the first direction;
a plurality of memory cells connected between the plurality of first wiring lines and the plurality of second wiring lines, each of which includes a resistance change memory element capable of exhibiting a first resistance state and a second resistance state having a higher resistance than that of the first resistance state, and a switching element connected in series with the resistance change memory element and having a characteristic of changing from an off state to an on state when a voltage applied between two terminals thereof increases and reaches a first voltage, and changing from an on state to an off state when a voltage applied between the two terminals decreases and reaches a second voltage that is lower than the first voltage; and
a determination operation control circuit that controls a determination operation of a resistance state of the resistance change memory element included in a selected memory cell of the plurality of memory cells connected between a selected first wiring line of the plurality of first wiring lines and a selected second wiring line of the plurality of second wiring lines, wherein
the determination operation control circuit is configured to:
during a first read period, set the switching element included in the selected memory cell to an on state by changing a voltage of the selected first wiring line at a first on-state setting time point while the selected second wiring line is set to a floating state, and acquire a first preliminary determination target voltage applied between the selected first wiring line and the selected second wiring line at a first preliminary determination target voltage acquisition time point at which a first elapsed time has elapsed from the first on-state setting time point;
during the first read period, set the switching element included in the selected memory cell to an on state by changing a voltage of the selected first wiring line at a second on-state setting time point while the selected second wiring line is set to a floating state, and acquire a second preliminary determination target voltage applied between the selected first wiring line and the selected second wiring line at a second preliminary determination target voltage acquisition time point at which a second elapsed time that is different from the first elapsed time has elapsed from the second on-state setting time point;
during a write period after the first read period, set a reference resistance state selected from the first resistance state and the second resistance state to the resistance change memory element included in the selected memory cell;
during a second read period after the write period, set the switching element included in the selected memory cell to an on state by changing a voltage of the selected first wiring line at a third on-state setting time point while the selected second wiring line is set to a floating state, and acquire a first preliminary reference voltage applied between the selected first wiring line and the selected second wiring line at a first preliminary reference voltage acquisition time point at which the first elapsed time has elapsed from the third on-state setting time point;

during the second read period, set the switching element included in the selected memory cell to an on state by changing a voltage of the selected first wiring line at a fourth on-state setting time point while the selected second wiring line is set to a floating state, and acquire a second preliminary reference voltage applied between the selected first wiring line and the selected second wiring line at a second preliminary reference voltage acquisition time point at which the second elapsed time has elapsed from the fourth on-state setting time point; and determine, based on a voltage difference between a determination target voltage obtained by adding the first preliminary determination target voltage and the second preliminary determination target voltage and a reference voltage obtained by adding the first preliminary reference voltage and the second preliminary reference voltage, a determination target resistance state that was set in the resistance change memory element included in the selected memory cell prior to the first read period.

15. The memory device of claim 14, wherein
the first on-state setting time point and the second on-state setting time point are at the same time point, and
the third on-state setting time point and the fourth on-state setting time point are at the same time point.

16. The memory device of claim 14, wherein
the first on-state setting time point is included in a first subperiod of the first read period, and the second on-state setting time point is included in a second subperiod after the first subperiod, and
the third on-state setting time point is included in a third subperiod of the second read period, and the fourth on-state setting time point is included in a fourth subperiod after the third subperiod.

17. The memory device of claim 14, wherein
the determination operation control circuit is configured to determine that the determination target resistance state is the same as the reference resistance state in a case where a voltage difference between the determination target voltage and the reference voltage is smaller than a reference voltage difference, and determine that the determination target resistance state is different from the reference resistance state in a case where a voltage difference between the determination target voltage and the reference voltage is equal to or greater than the reference voltage difference.

18. The memory device of claim 14, wherein
the resistance change memory element is a magnetoresistance effect element.

* * * * *